United States Patent
Inoue et al.

(10) Patent No.: US 9,318,659 B2
(45) Date of Patent: Apr. 19, 2016

(54) NITRIDE SEMICONDUCTOR LIGHT EMITTING ELEMENT HAVING LIGHT EMITTING LAYER INCLUDING INXGA1-XN WELL LAYER AND LED SYSTEM

(71) Applicant: Panasonic Corporation, Osaka (JP)

(72) Inventors: Akira Inoue, Osaka (JP); Shunji Yoshida, Osaka (JP); Toshiya Yokogawa, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 363 days.

(21) Appl. No.: 13/974,211

(22) Filed: Aug. 23, 2013

(65) Prior Publication Data

US 2013/0334986 A1    Dec. 19, 2013

Related U.S. Application Data

(63) Continuation of application No. PCT/JP2012/005775, filed on Sep. 12, 2012.

(30) Foreign Application Priority Data

Sep. 29, 2011  (JP) .................. 2011-215130
Sep. 29, 2011  (JP) .................. 2011-215206

(51) Int. Cl.
*H01L 33/00* (2010.01)
*H01L 33/32* (2010.01)
(Continued)

(52) U.S. Cl.
CPC ............ *H01L 33/32* (2013.01); *H01L 33/0058* (2013.01); *H01L 33/16* (2013.01);
(Continued)

(58) Field of Classification Search
CPC . H01L 33/32; H01L 27/153; H01L 21/02458; H01L 21/0251; H01L 21/0254; H01L 21/02609; H01L 21/0262; H01L 33/0058; H01L 33/025; H01L 33/16
USPC ..................... 257/88, 103; 315/312
See application file for complete search history.

(56) References Cited

U.S. PATENT DOCUMENTS

2003/0151044 A1* 8/2003 Yamada ................. B82Y 20/00
                                                                257/14
2005/0236627 A1  10/2005 Kim et al.
(Continued)

FOREIGN PATENT DOCUMENTS

JP    2003-234545 A    8/2003
JP    2004-179428 A    6/2004
(Continued)

OTHER PUBLICATIONS

International Search Report for corresponding International Application No. PCT/JP2012/005775 mailed Oct. 9, 2012.
(Continued)

*Primary Examiner* — Duy T Nguyen
(74) *Attorney, Agent, or Firm* — Renner, Otto, Boisselle & Sklar, LLP

(57) ABSTRACT

A nitride semiconductor light emitting element includes a light emitting layer. The light emitting layer includes an $In_xGa_{1-x}N$ well layer ($0<x\leq1$) having a principal surface that is an m-plane. A profile in a depth direction (depth profile) of an In composition ratio x in the $In_xGa_{1-x}N$ well layer has a plurality of peaks. Values of the In composition ratios x at the respective plurality of peaks are different from one another.

10 Claims, 13 Drawing Sheets

(51) Int. Cl.
*H01L 33/16* (2010.01)
*H05B 33/08* (2006.01)
*H01L 33/02* (2010.01)
*H01L 21/02* (2006.01)

(52) U.S. Cl.
CPC ........ *H05B33/0803* (2013.01); *H01L 21/0251* (2013.01); *H01L 21/0254* (2013.01); *H01L 21/0262* (2013.01); *H01L 21/02458* (2013.01); *H01L 21/02609* (2013.01); *H01L 33/025* (2013.01)

(56) References Cited

U.S. PATENT DOCUMENTS

| | | | |
|---|---|---|---|
| 2006/0193359 A1 | 8/2006 | Kuramoto | |
| 2007/0262293 A1* | 11/2007 | Fujikura | B82Y 20/00 257/13 |
| 2008/0273566 A1 | 11/2008 | Nishinaka et al. | |
| 2008/0283822 A1 | 11/2008 | Yui | |
| 2009/0166668 A1 | 7/2009 | Shakuda | |
| 2009/0258452 A1 | 10/2009 | Enya et al. | |
| 2009/0268768 A1 | 10/2009 | Ueno et al. | |

FOREIGN PATENT DOCUMENTS

| | | |
|---|---|---|
| JP | 2006-270028 A | 10/2006 |
| JP | 2007-150066 A | 6/2007 |
| JP | 2009-076684 A | 4/2009 |
| JP | 2009-245982 A | 10/2009 |
| JP | 2009-253164 A | 10/2009 |
| JP | 2010-067952 A | 3/2010 |
| JP | 2010-092898 A | 4/2010 |
| JP | 2011-077109 A | 4/2011 |

OTHER PUBLICATIONS

Form PCT/ISA/237 for corresponding International Application No. PCT/JP2012/005775 dated Oct. 9, 2012 and partial English translation.

* cited by examiner

● N
◉ Ga m-PLANE c-PLANE

FIG.4
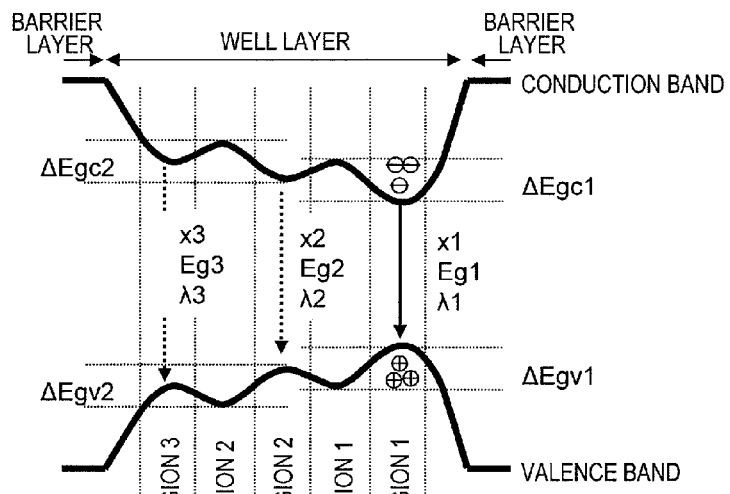
(a)
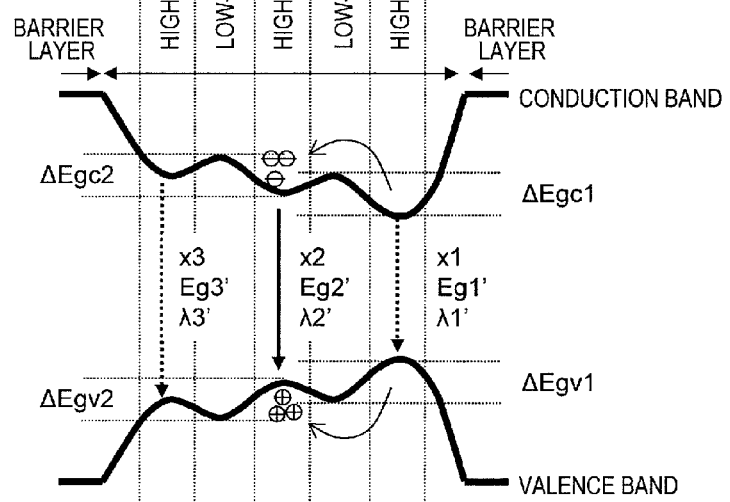
(b)
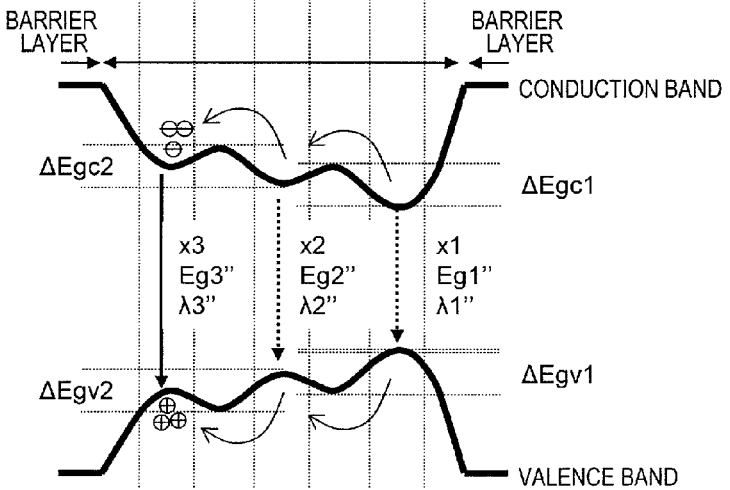
(c)

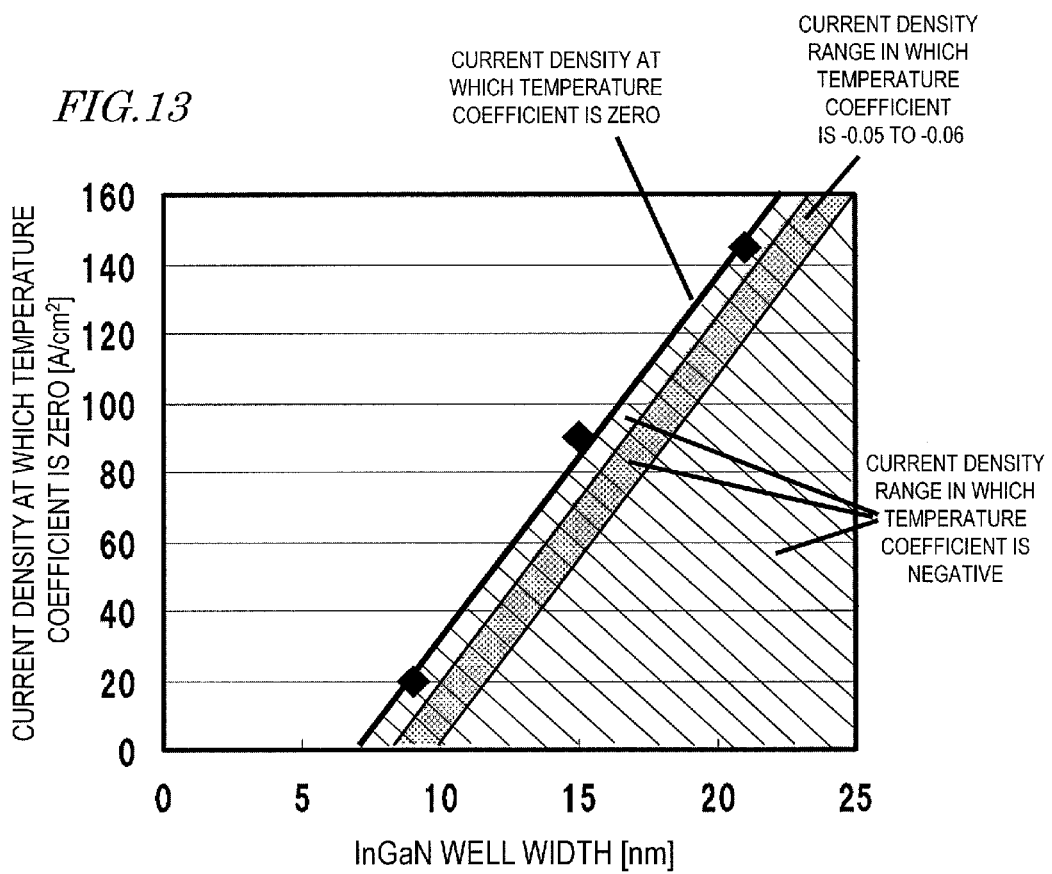

NITRIDE SEMICONDUCTOR LIGHT EMITTING ELEMENT HAVING LIGHT EMITTING LAYER INCLUDING INXGA1-XN WELL LAYER AND LED SYSTEM

This is a continuation of International Application No. PCT/JP2012/005775, with an international filing date of Sep. 12, 2012, which claims priority of Japanese Patent Applications No. 2011-215130, filed on Sep. 29, 2011 and No. 2011-215206, filed on Sep. 29, 2011, the contents of which are hereby incorporated by reference.

BACKGROUND

1. Technical Field

The present application relates to a nitride semiconductor light emitting element and an LED system including a plurality of nitride semiconductor light emitting elements.

2. Description of the Related Art

A nitride semiconductor including nitrogen (N) as a group V element is a prime candidate for a material to make a short-wavelength light emitting element because of its wide bandgap. Among other things, gallium nitride-based compound semiconductors have been researched and developed particularly extensively. As a result, blue light emitting diodes (LEDs), green LEDs, and blue semiconductor lasers, which use the gallium nitride-based compound semiconductors, have already been used in actual products.

Nitride semiconductors include compound semiconductors that substitute at least one of aluminum (Al) and indium (In) for some or all of gallium (Ga). Such nitride semiconductors are expressed by a composition formula of $Al_xGa_yIn_zN$ ($0 \leq x, y, z \leq 1$, $x+y+z=1$). In the following, the gallium nitride-based compound semiconductors are referred to as nitride semiconductors.

By replacing Ga atoms with Al atoms, the bandgap can be greater than that of GaN. By replacing Ga atoms with In atoms, the bandgap can be smaller than that of GaN. In this manner, not only nitride semiconductor elements that emit short-wavelength light such as blue light or green light but also nitride semiconductor elements that emit orange light or red light are obtained. Due to these characteristics, a nitride semiconductor light emitting element is also expected to be applied to an image display device or an illumination device.

Nitride semiconductors have a wurtzite crystal structure. FIGS. 1A, 1B, and 1C illustrate planes of the wurtzite crystal structure expressed in four-digit indices (hexagonal indices). Four-digit indices use basis vectors denoted by a1, a2, a3, and c to express crystal planes and orientations. The basis vector c runs in a [0001] direction, which is called "c-axis". A plane perpendicular to the c-axis is called "c-plane" or "(0001) plane". FIG. 1A illustrates not only the c-plane but also an a-plane and an m-plane. Further, FIG. 1B illustrates an r-plane, and FIG. 1C illustrates a (11-22) plane.

FIG. 2A illustrates a crystal structure of a nitride semiconductor represented by a ball-and-stick model. FIG. 2B illustrates an atomic arrangement in the vicinity of a surface of the m-plane observed from an a-axis direction. The m-plane is perpendicular to the drawing sheet of FIG. 2B. FIG. 2C illustrates an atomic arrangement on a surface of a +c-plane observed from an m-axis direction. The c-plane is perpendicular to the drawing sheet of FIG. 2C. As can be seen from FIG. 2B, N atoms and Ga atoms are located on a plane in parallel with the m-plane. On the other hand, with regard to the c-plane, as can be seen from FIG. 2C, a layer in which only Ga atoms are placed and a layer in which only N atoms are placed are formed.

Conventionally, when manufacturing a semiconductor element from a nitride semiconductor, a c-plane substrate, i.e., a substrate having a (0001) plane as a principal surface is used as a substrate on which a nitride semiconductor crystal is to be grown. In this case, because of this arrangement of Ga atoms and N atoms, spontaneous electrical polarization occurs in the nitride semiconductor in the c-axis direction. The "c-plane" is therefore also called "polar plane". As a result of the electrical polarization, a piezo-electric field is generated along the c-axis direction in a quantum well of InGaN in a light emitting layer of the nitride semiconductor light emitting element, and shifts the distribution of electrons and holes within the light emitting layer, thereby lowering the internal quantum efficiency of the light emitting layer through quantum-confined Stark effect of carriers, which has been a problem. In order to inhibit lowering of internal quantum efficiency of the light emitting layer, the thickness of the light emitting layer formed on the (0001) plane is designed to be 3 nm or less.

Further, in recent years, manufacturing a light emitting element using a substrate having, as a surface, the m-plane or the a-plane which are called non-polar planes, or a –r-plane or the (11-22) plane which are called semi-polar planes is under study. As illustrated in FIG. 1, m-planes in the wurtzite crystal structure are parallel to the c-axis and are six equivalent planes orthogonal to the c-planes. For instance, a (1-100) plane perpendicular to a [1-100] direction in FIG. 1 is an m-plane. Other m-planes equivalent to the (1-100) plane include a (-1010) plane, a (10-10) plane, a (- 1100) plane, a (01-10) plane, and a (0-110) plane. The sign "–" to the left of a number inside the parentheses that indicates a Miller index means a "bar".

As illustrated in FIG. 2B, Ga atoms and N atoms on an m-plane exist on the same atomic plane, and therefore, electrical polarization does not occur in a direction perpendicular to the m-plane. Accordingly, using a semiconductor multi-layer structure that is formed on an m-plane in the manufacture of a light emitting element prevents the generation of a piezo-electric field in the light emitting layer, thereby solving the problem of lowering the internal quantum efficiency which is caused by quantum-confined Stark effect of carriers. The same can be said with regard to the a-plane which is a non-polar plane other than the m-plane, and a similar effect can be obtained with regard to the –r-plane or the (11-22) plane which are called semi-polar planes.

SUMMARY

It is known that the bandgap of a semiconductor becomes smaller as the temperature rises (Varshni Effect). When the temperature of a nitride semiconductor light emitting element rises, the bandgap of a light emitting layer in the nitride semiconductor light emitting element becomes smaller, and thus, the wavelength of light generated in the light emitting layer becomes longer.

According to an embodiment of the present disclosure, an m-plane nitride semiconductor light emitting element can be provided which inhibits change in wavelength when the temperature is changed, and an m-plane nitride semiconductor light emitting element can be provided in which the wavelength of light becomes shorter when the temperature rises.

In one general aspect, a nitride semiconductor light emitting element disclosed herein includes a light emitting layer. The light emitting layer includes an $In_xGa_{1-x}N$ well layer ($0<x\leq1$) having a principal surface that is an m-plane. A profile in a depth direction (depth profile) of an In composition ratio x in the $In_xGa_{1-x}N$ well layer has a plurality of peaks.

Values of the In composition ratios x at the respective plurality of peaks are different from one another.

According to the above aspect, a nitride semiconductor light emitting element can be realized in which the temperature coefficient of the wavelength is close to zero, or is negative.

These general and specific aspects may be implemented using a method. Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

Portions (a), (b) and (a) of FIG. 4 illustrate a mechanism for maintaining the emission wavelength even when the temperature is changed.

Figure 5:
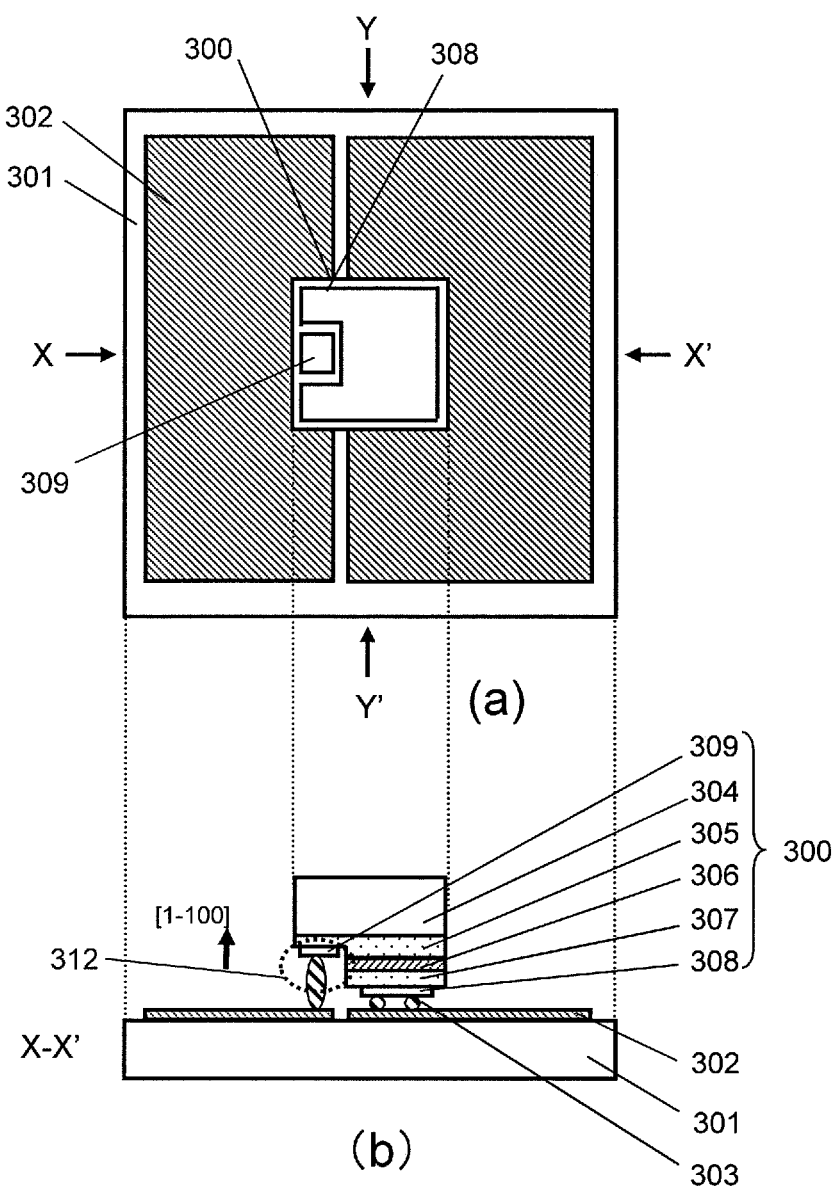

Portions (a) and (b) of FIG. 5 illustrate a structure of a nitride semiconductor light emitting element (flip chip) according to a first embodiment.

Figure 6:
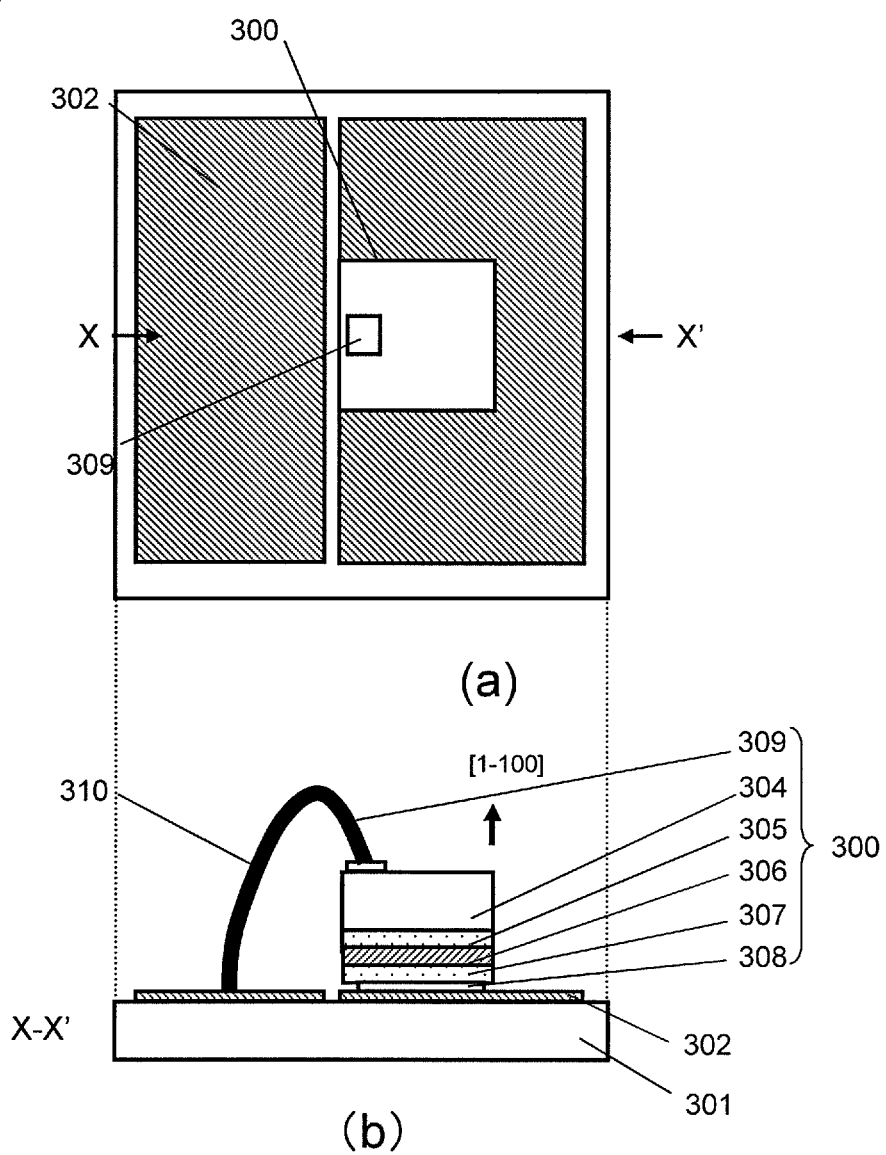

Portions (a) and (b) of FIG. 6 illustrate a structure of a nitride semiconductor light emitting element (wire bonding) according to a first embodiment.

Figure 7:
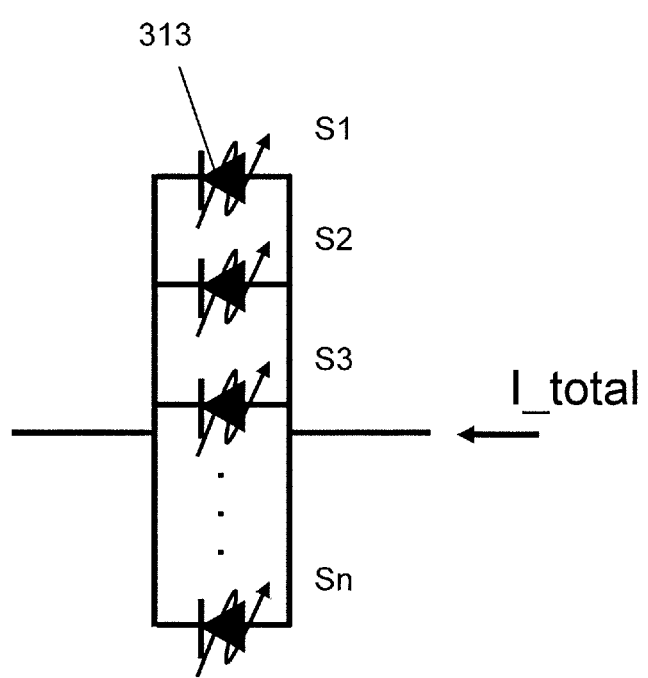

FIG. 7 illustrates an LED system according to a second embodiment.

Figure 8A:
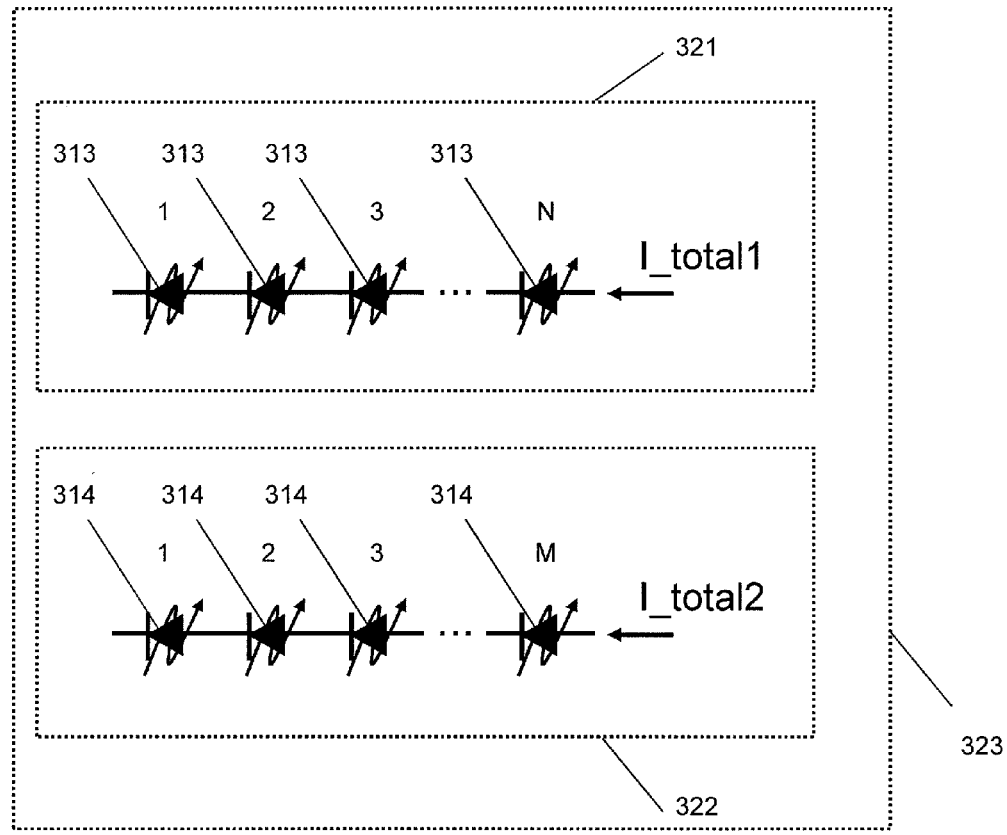
Figure 8B:
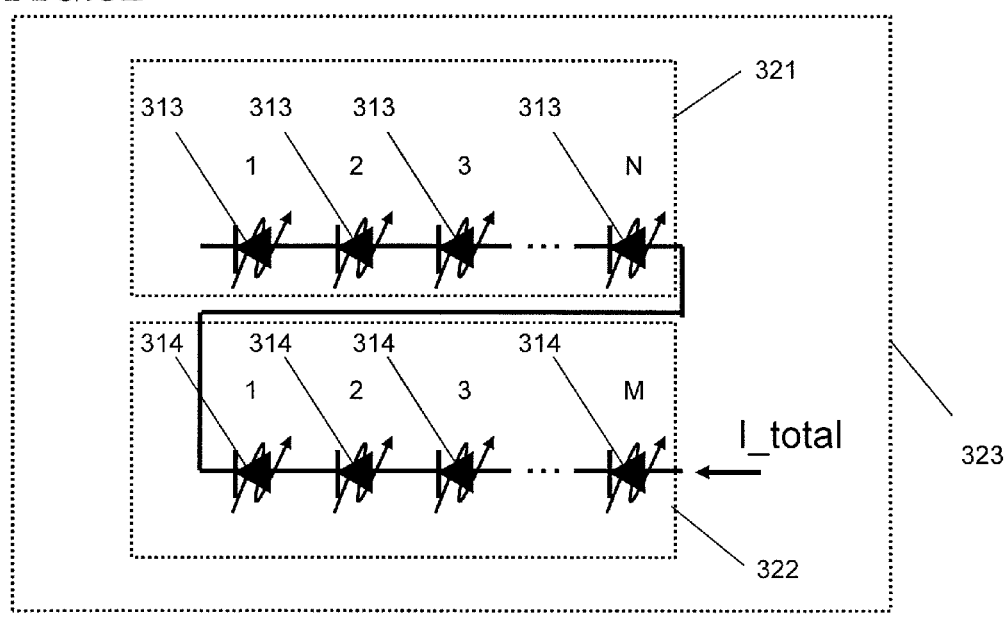

FIGS. 8A and 8B illustrate LED systems according to a fourth embodiment.

Figure 9A:
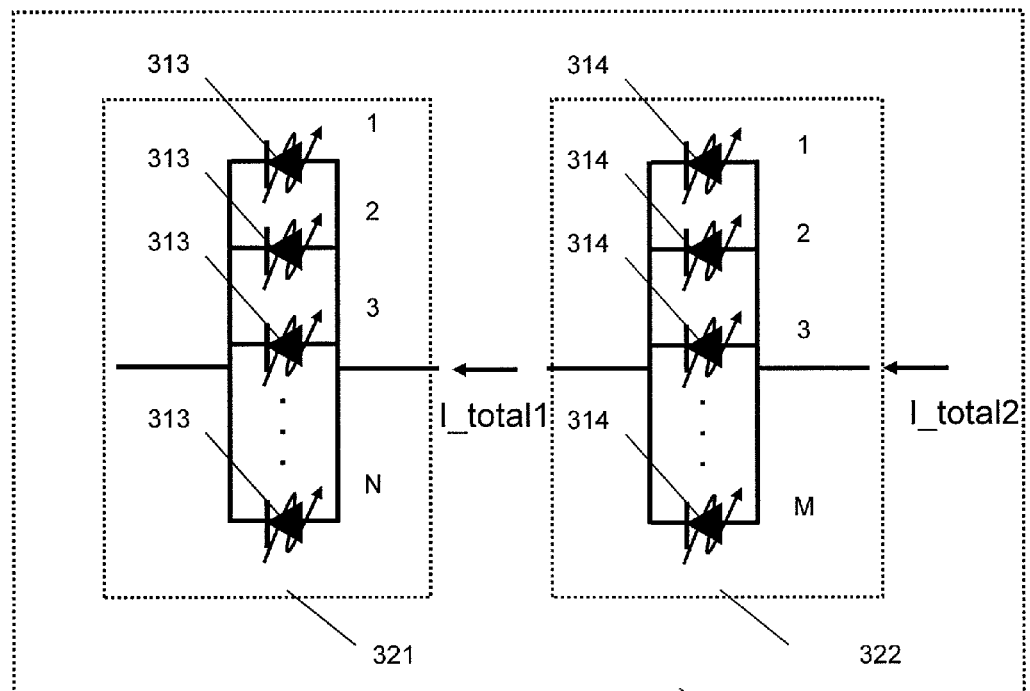
Figure 9B:
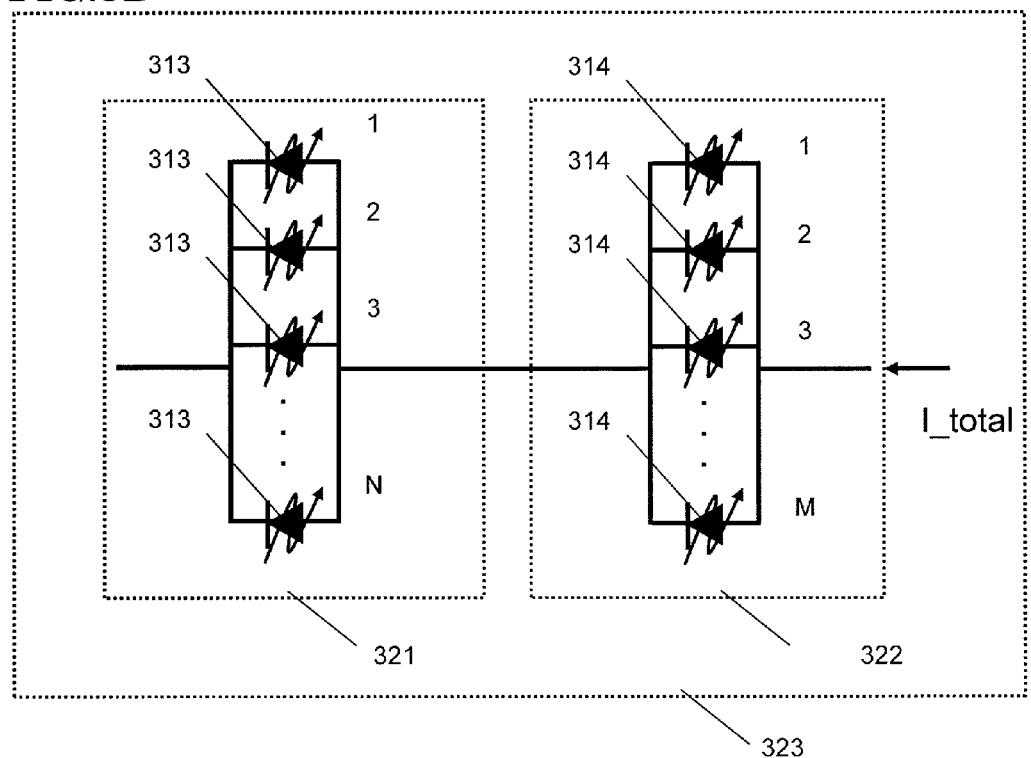

FIGS. 9A and 9B illustrate LED systems according to a fifth embodiment.

Figure 10:
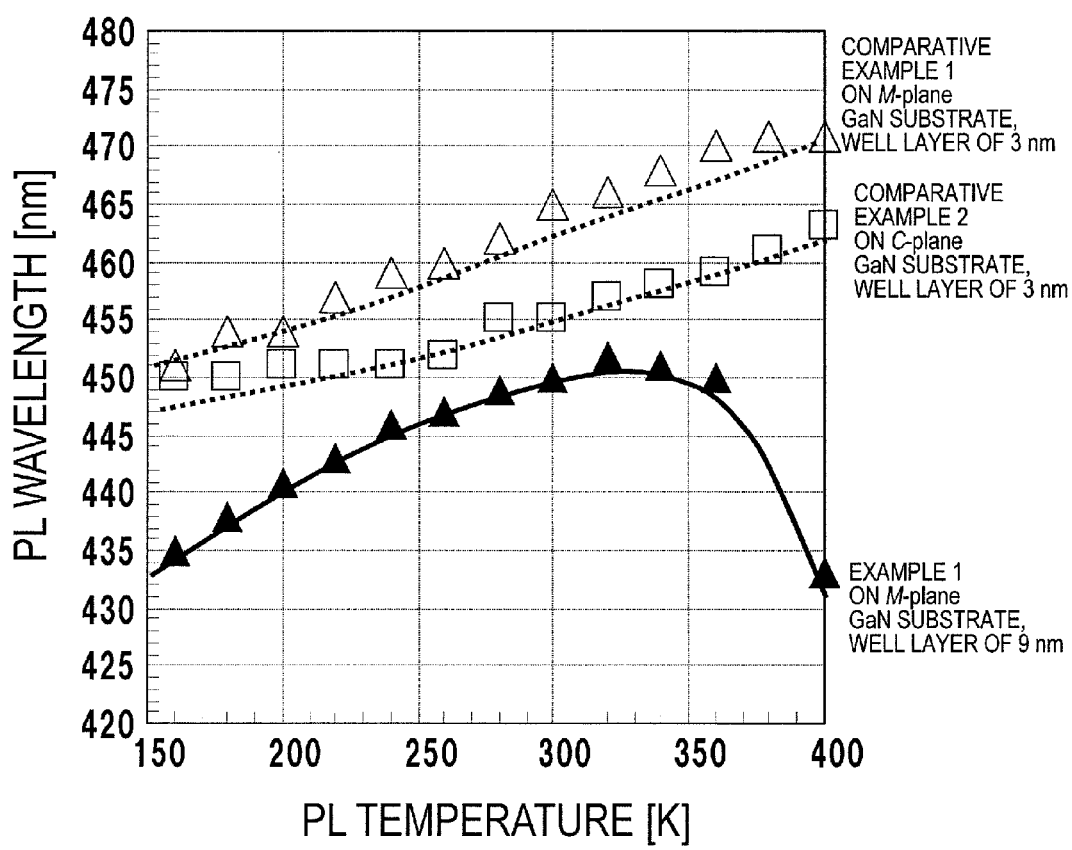

FIG. 10 is a graph showing temperature characteristics of photoluminescence measurements of an InGaN well layer in Example 1.

Figure 11:
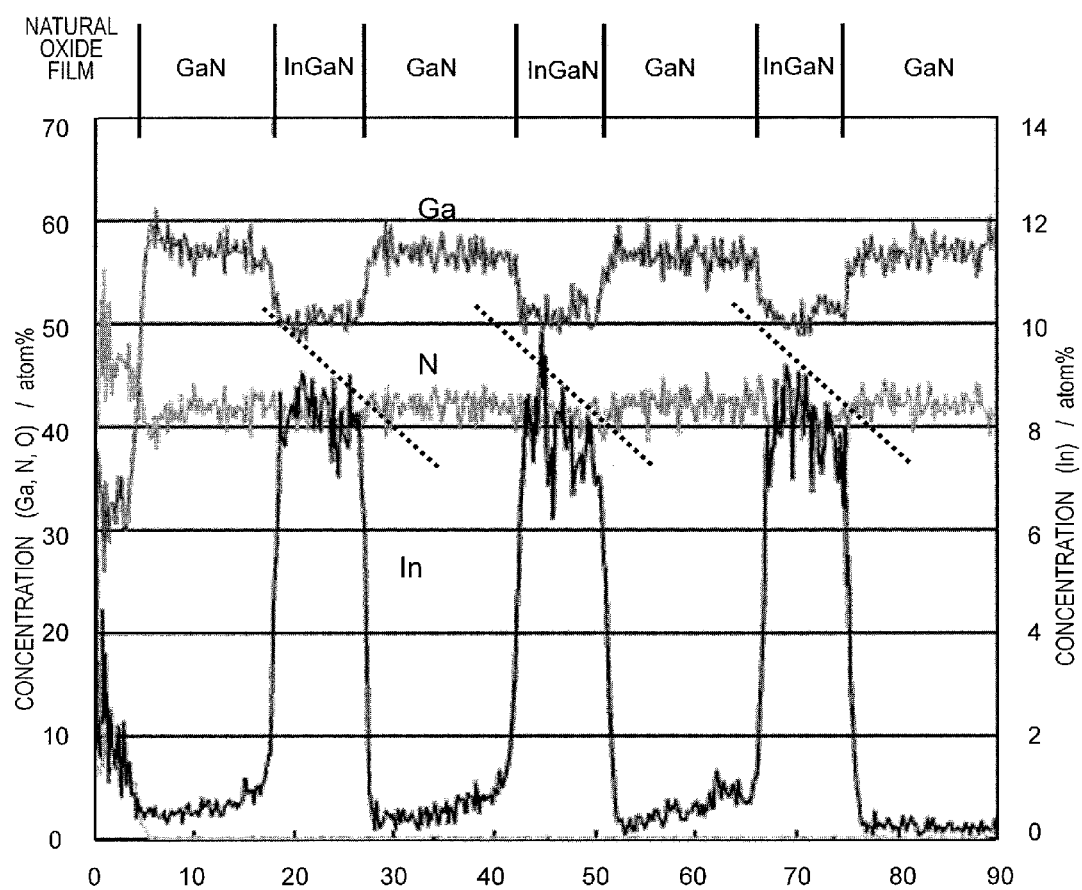

FIG. 11 is a graph showing the results of measurements of In composition ratio of an InGaN well layer having a thickness of 9 nm formed on an M-plane GaN substrate in Example 1.

Figure 12:
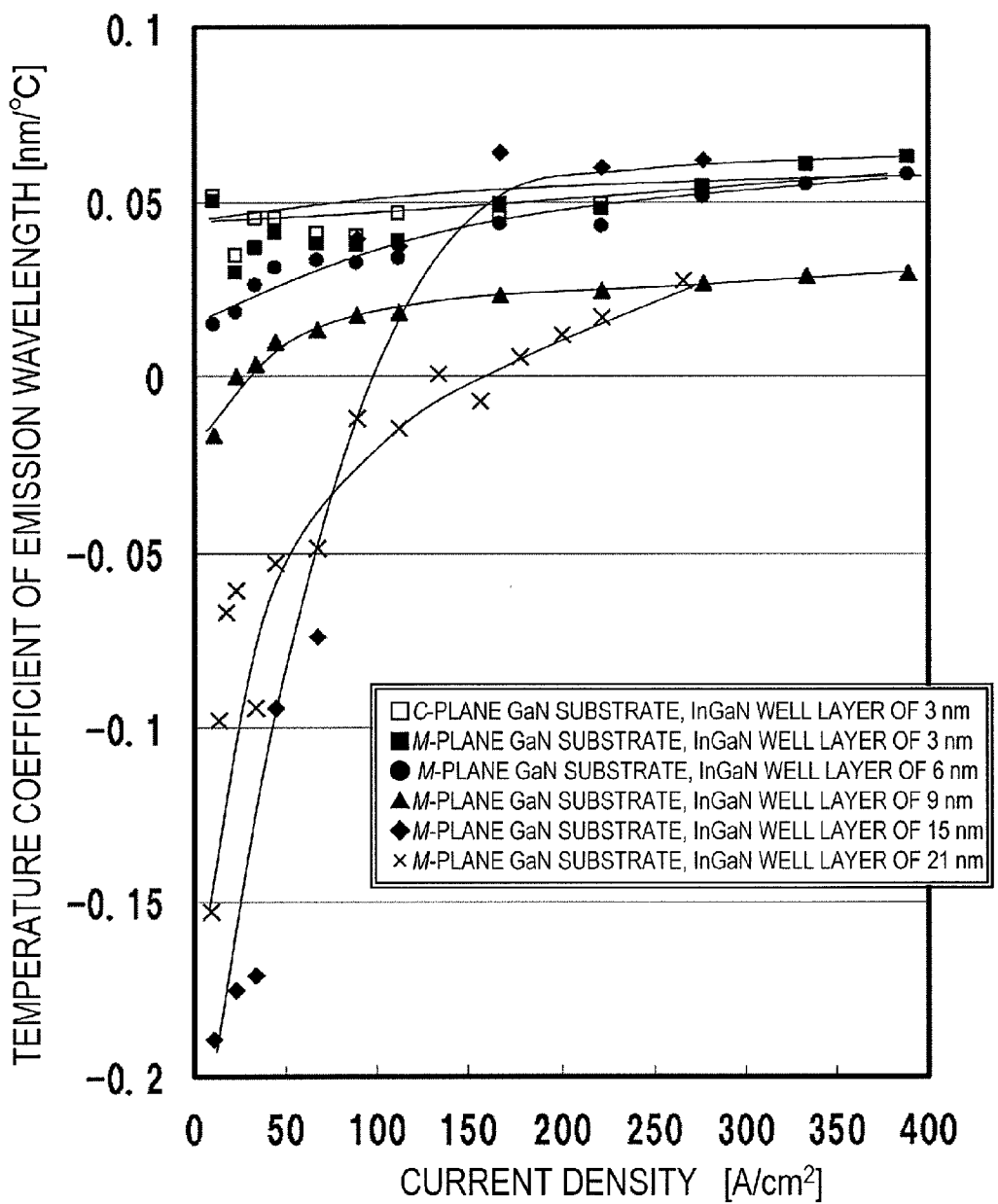

FIG. 12 is a graph showing the current density of an LED and the temperature coefficient of an emission wavelength in Example 2.

FIG. 13 is a graph showing the relationship between the InGaN well width of an LED and the current density when the temperature coefficient of the emission wavelength is zero or negative in Example 2.

DETAILED DESCRIPTION

The temperature dependence of the bandgap of GaN which is a nitride semiconductor is approximated by (Expression 1).

[Math. 1]

$$E_g[\text{eV}] = 3.47 - 7.7 \times 10^{-4} \times \frac{T[K]^2}{T[K] + 600} \quad \text{(Expression 1)}$$

where T [K] is the temperature (absolute temperature) of GaN. Further, the emission wavelength is given by (Expression 2).

[Math. 2]

$$\lambda[\text{nm}] = \frac{1239.8}{E_g[\text{eV}]} \quad \text{(Expression 2)}$$

In a range in which the temperature is about 213 K (−60° C.) to 473 K (200° C.), the temperature (horizontal axis) and the emission wavelength (vertical axis) of GaN are substantially in a linear relationship, and, as the temperature rises by 1 K, the emission wavelength becomes longer by about 0.05 nm. The gradient of the temperature characteristics of the wavelength is referred to as "temperature coefficient of the wavelength". Then, the temperature coefficient of the wavelength with regard to GaN is about +0.05 [nm/K]. The temperature coefficient of the wavelength depends on the material. With regard to InGaN of which emission wavelength at 298 K (25° C.) is about 450 nm, the temperature coefficient of the wavelength is about +0.06 [nm/K].

Generally, as the temperature rises, the interatomic distance in a crystal forming the nitride semiconductor becomes larger, and thus, the bandgap becomes smaller and the emission wavelength becomes longer. In a conventional nitride semiconductor, the temperature coefficient has been always positive.

When an LED is used for indoor use as a projector light source or an LCD backlight, the amount of change in wavelength when the temperature is changed is required to be, for example, 2 nm or less when the ambient temperature is from 243 K (−30° C.) to 353 K (80° C.). When an LED is used for outdoor use as a street light or a vehicle head lamp, under the ambient temperature which is from 233 K (−40° C.) to 393 K (120° C.), the amount of change in wavelength as the temperature is changed is required to be, for example, 5 nm or less. In the case of larger current or larger emission amount, the ambient temperature is further required to be from about 233 K (−40° C.) to about 453 K (180° C.). When an LED is used in this temperature range, the emission wavelength difference between a low temperature case and a high temperature case is as large as 10 nm or more.

The present inventors have focused attentions on the structure of an InGaN well layer which is a light emitting layer for the purpose of controlling the temperature coefficient of the wavelength and change in wavelength when the temperature is changed. When the operating range of the LED is from about 233 K (−40° C.) to about 453 K (180° C.), the bandgap is lowered by about 100 meV from (Expression 1). In a conventional InGaN well layer, an electron-hole pair corresponding to a state in which the energy difference that is determined by the bottom of the conduction band and the upper level of the valence band is the smallest, that is, the bandgap, preferentially emits light, and thus, as the temperature rises, the emission wavelength becomes longer.

Therefore, the present inventors have invented an InGaN well structure in which the temperature coefficient is smaller and an InGaN well structure in which the temperature coefficient is negative, by exciting, with heat, electrons and holes into a high energy state and causing light emission while their high energy state is maintained.

Specifically, when an LED is heated to 453 K (180° C.), the activation energy generated by the thermal excitation reaches about 40 meV. By giving the activation energy independently to the electrons and the holes, electron-hole pairs emit light with their energy state being raised by about 80 meV. The bandgap of a nitride semiconductor is lowered by about 100 meV at 453 K (180° C.), and thus, the activation of the electrons and the holes by thermal excitation compensates for change in emission wavelength.

In a conventional InGaN light emitting layer, an electron-hole pair in a light emitting layer preferentially emits light at a location at which the bandgap is the smallest, and thus, even if the electrons and the holes are excited into a high energy state by heat, the element emits light only at the emission wavelength which is determined by the bandgap. For example, Japanese Patent Application Laid-Open Publication No. 2009-253164 describes that, in a plane having a principal surface that is tilted relative to the (0001) plane, the In composition ratio varies in the thickness direction. However, the thickness of the InGaN well layer is as small as 6 nm, and further, the relationship with the temperature coefficient of the wavelength was obscure. Therefore, the present inventors diligently reviewed the structure of an InGaN well layer, and have realized a novel structure in which the In composition ratio changes in a wave-like manner in the thickness direction of the InGaN well layer.

A nitride semiconductor light emitting element of the present disclosure includes a light emitting layer. The light emitting layer includes an $In_xGa_{1-x}N$ well layer ($0<x\leq1$) having a principal surface that is an m-plane. A profile in a depth direction (depth profile) of an In composition ratio x in the $In_xGa_{1-x}N$ well layer has a plurality of peaks. Values of the In composition ratios x at the respective plurality of peaks are different from one another.

In one embodiment, a temperature coefficient of the wavelength of light generated in the light emitting layer is zero at any one of temperatures from 243 K to 353 K, and the difference between a shorter one of the wavelength at 243 K and the wavelength at 353 K, and the wavelength at a temperature at which the temperature coefficient is zero is 2 nm or less.

In one embodiment, the temperature coefficient of the wavelength of light generated in the light emitting layer is zero at any one of temperatures from 233 K to 393 K, and the difference between a shorter one of the wavelength at 233 K and the wavelength at 393 K, and the wavelength at a temperature at which the temperature coefficient is zero is 5 nm or less.

In one embodiment, the average value of the In composition ratios x in the $In_xGa_{1-x}N$ well layer is not less than 0.08 and not more than 0.40.

In one embodiment, the difference between the minimum value of the In composition ratios x in a region between adjacent two peaks of the plurality of peaks and a larger one of the In composition ratios x of the adjacent two peaks is not less than 0.005 and not more than 0.04.

In one embodiment, the nitride semiconductor light emitting element further includes a p-type layer and an n-type layer that are provided on the principal surface side and a rear surface side, respectively, of the light emitting layer. The plurality of peaks include three or more peaks. The values of the In composition ratios x at the three or more peaks become smaller or larger in the direction from the p-type layer toward the n-type layer.

In one embodiment, the nitride semiconductor light emitting element further includes a p-type layer and an n-type layer that are provided on the principal surface side and a rear surface side, respectively, of the light emitting layer. The plurality of peaks include four or more peaks. The values of the In composition ratios x at the four or more peaks are arranged so as to be V-shaped or inverted V-shaped in the direction from the p-type layer toward the n-type layer.

In one embodiment, the thickness of the $In_xGa_{1-x}N$ well layer is 7 nm or more.

In one embodiment, W is 7 nm or more and the nitride semiconductor light emitting element is operated under a state in which the following relational expression is satisfied, $$10.42 \times W[nm] - 81.3 \leq J[A/cm^2] \leq 10.42 \times W[nm] - 61.3 \quad \text{[Math. 3]}$$

where W is the thickness of the $In_xGa_{1-x}N$ well layer, I is the operating current value of the nitride semiconductor light emitting element, S_well is the area of the $In_xGa_{1-x}N$ well layer in the top view of the nitride semiconductor light emitting element, and a current density J [A/cm²] is a value obtained by dividing the operating current value I by the area S_well.

In one embodiment, the absolute value of the temperature coefficient of the wavelength of light generated in the light emitting layer is 0.03 or less.

In one embodiment, W is 7 nm or more and the nitride semiconductor light emitting element is operated under a state in which the following relational expression is satisfied, $$J[A/cm^2] < 10.42 \times W[nm] - 71.3 \quad \text{[Math. 4]}$$

where W is the thickness of the $In_xGa_{1-x}N$ well layer, I is the operating current value of the nitride semiconductor light emitting element, S_well is the area of the $In_xGa_{1-x}N$ well layer in the top view of the nitride semiconductor light emitting element, and a current density J [A/cm²] is a value obtained by dividing the operating current value I by the area S_well.

In one embodiment, the temperature coefficient of the wavelength of light generated in the light emitting layer is a negative value.

An LED system of the present disclosure includes: a plurality of the nitride semiconductor light emitting elements as set forth in any one of the embodiments, in which: the plurality of the nitride semiconductor light emitting elements are connected in parallel; and a thickness W of the $In_xGa_{1-x}N$ well layer is the same throughout the plurality of the nitride semiconductor light emitting elements, W is 7 nm or more, and the LED system is operated under a state in which the following relational expression is satisfied, $$10.42 \times W[nm] - 81.3 \leq \frac{I\_total}{S\_well\_total}[A/cm^2] \leq 10.42 \times W[nm] - 61.3 \quad \text{[Math. 5]}$$

where W is the thickness of the $In_xGa_{1-x}N$ well layer, I_total is the operating current value of the entire plurality of the nitride semiconductor light emitting elements that are connected in parallel, S_well_total is the total of the areas of the $In_xGa_{1-x}N$ well layers in the top view of the respective plurality of the nitride semiconductor light emitting elements, and a current density J_total [A/cm²] is a value obtained by dividing I_total by S_well_total.

Another LED system of the present disclosure includes N(N is an integer of 2 or more) nitride semiconductor light emitting elements as set forth in any one of the embodiments. The N nitride semiconductor light emitting elements are connected in parallel, and a thickness W and an area S_well are the same throughout the N nitride semiconductor light emitting elements, W is 7 nm or more, and the LED system is operated under a state in which the following relational expression is satisfied, $$10.42 \times W[\text{nm}] - 81.3 \leq \qquad \text{[Math. 6]}$$
$$\frac{I\_total}{N \times S\_well}[A/\text{cm}^2] \leq 10.42 \times W[\text{nm}] - 61.3$$

where W is the thickness of the $In_xGa_{1-x}N$ well layer, S_well is the area of the $In_xGa_{1-x}N$ well layer in the top view of the N nitride semiconductor light emitting elements, and I_total is the operating current value of the entire N nitride semiconductor light emitting elements that are connected in parallel.

Another LED system of the present disclosure includes: one or a plurality of the nitride semiconductor light emitting elements as set forth in any one of the embodiments; and a current supply portion for supplying current to the one or a plurality of the nitride semiconductor light emitting elements so that the temperature coefficient of the wavelength of light generated in the light emitting layer is zero at any one of temperatures from 243 K to 353 K, and so that the difference between a shorter one of the wavelength at 243 K and the wavelength at 353 K, and the wavelength at a temperature at which the temperature coefficient is zero is 2 nm or less.

Another LED system of the present disclosure includes: one or a plurality of the nitride semiconductor light emitting elements as set forth in any one of the embodiments; and a current supply portion for supplying current to the one or a plurality of the nitride semiconductor light emitting elements so that the temperature coefficient of the wavelength of light generated in the light emitting layer is zero at any one of temperatures from 233 K to 393 K, and so that the difference between a shorter one of the wavelength at 233 K and the wavelength at 393 K, and the wavelength at a temperature at which the temperature coefficient is zero is 5 nm or less.

Another LED system of the present disclosure includes: one or a plurality of first nitride semiconductor light emitting elements each including a first light emitting layer; and one or a plurality of second nitride semiconductor light emitting elements each including a second light emitting layer. The first light emitting layer includes an $In_xGa_{1-x}N$ well layer ($0<x\leq1$) having a principal surface that is an m-plane. A profile in a depth direction (depth profile) of an In composition ratio x in the $In_xGa_{1-x}N$ well layer has a plurality of peaks. The values of the In composition ratios x at the respective plurality of peaks are different from one another. In a predetermined temperature range, the temperature coefficient of the wavelength of light generated in the first light emitting layer is negative, and the temperature coefficient of the wavelength of light generated in the second light emitting layer is positive.

In one embodiment, W is 7 nm or more and the LED system is operated under a state in which the following relational expression is satisfied, $$J[A/\text{cm}^2]<10.42 \times W[\text{nm}]-71.3 \qquad \text{[Math. 7]}$$

where W is the thickness of the $In_xGa_{1-x}N$ well layer, I is the operating current value of the first nitride semiconductor light emitting elements, S_well is the area of the $In_xGa_{1-x}N$ well layer in the top view of the first nitride semiconductor light emitting elements, and a current density J [A/cm$^2$] is a value obtained by dividing the operating current value I by the area S_well.

In one embodiment, in the predetermined temperature range, the difference between a maximum value and a minimum value of a center wavelength of synthesized light formed by synthesizing light from the one or a plurality of first nitride semiconductor light emitting elements and light from the one or a plurality of second nitride semiconductor light emitting elements is 5 nm or less.

In one embodiment, a total light amount of light from the one or a plurality of first nitride semiconductor light emitting elements and a total light amount of light from the one or a plurality of second nitride semiconductor light emitting elements are substantially equal to each other.

In one embodiment, the LED system includes a plurality of the first nitride semiconductor light emitting elements, the plurality of first nitride semiconductor light emitting elements are connected in series, and W is 8 nm or more and the LED system is operated under a state in which the following relational expression is satisfied, $$10.42 \times W[\text{nm}] - 106.3 < \qquad \text{[Math. 8]}$$
$$\frac{I\_total}{S\_well}[A/\text{cm}^2] < 10.42 \times W[\text{nm}] - 86.3$$

where W is the thickness of the $In_xGa_{1-x}N$ well layer, I_total is the current value of current that flows through the plurality of first nitride semiconductor light emitting elements connected in series, and S_well is the area of the $In_xGa_{1-x}N$ well layer in the top view of the plurality of first nitride semiconductor light emitting elements.

In one embodiment, the LED system includes a plurality of the first nitride semiconductor light emitting elements, the plurality of first nitride semiconductor light emitting elements are connected in parallel, and W is 8 nm or more and the LED system is operated under a state in which the following relational expression is satisfied, $$10.42 \times W[\text{nm}] - 106.3 < \qquad \text{[Math. 9]}$$
$$\frac{I\_total}{S\_well \times N}[A/\text{cm}^2] < 10.42 \times W[\text{nm}] - 86.3$$

where W is the thickness of the $In_xGa_{1-x}N$ well layer, I_total is the current value of current that flows through the plurality of first nitride semiconductor light emitting elements connected in parallel, S_well is the area of the $In_xGa_{1-x}N$ well layer in the top view of the plurality of first nitride semiconductor light emitting elements.

In one embodiment, in a temperature range of 243 K to 353 K, the difference between a maximum value and a minimum value of a center wavelength of synthesized light formed by synthesizing light from the one or a plurality of first nitride semiconductor light emitting elements and light from the one or a plurality of second nitride semiconductor light emitting elements is 2 nm or less.

In one embodiment, in a temperature range of 233 K to 393 K, the difference between a maximum value and a minimum value of a center wavelength of synthesized light formed by synthesizing light from the one or a plurality of first nitride semiconductor light emitting elements and light from the one or a plurality of second nitride semiconductor light emitting elements is 5 nm or less.

In one embodiment, the average value of the In composition ratios x in the $In_xGa_{1-x}N$ well layer is not less than 0.08 and not more than 0.40.

In one embodiment, the difference between the minimum value of the In composition ratios x in a region between adjacent two peaks of the plurality of peaks and a larger one of the In composition ratios x of the adjacent two peaks is not less than 0.005 and not more than 0.04.

In one embodiment, the first nitride semiconductor light emitting elements further includes: a p-type layer and an n-type layer that are provided on the principal surface side and a rear surface side, respectively, of the first light emitting layer. The plurality of peaks include three or more peaks. The values of the In composition ratios x at the three or more peaks become smaller or larger in the direction from the p-type layer toward the n-type layer.

In one embodiment, the first nitride semiconductor light emitting elements further includes: a p-type layer and an n-type layer that are provided on the principal surface side and a rear surface side, respectively, of the first light emitting layer. The plurality of peaks include four or more peaks. The values of the In composition ratios x at the four or more peaks are arranged so as to be V-shaped or inverted V-shaped in the direction from the p-type layer toward the n-type layer.

In one embodiment, the thickness of the $In_xGa_{1-x}N$ well layer is 7 nm or more.

In one embodiment, the predetermined temperature range is a range of not less than 320 K and not more than 453 K.

In the following, as Embodiments 1 and 2, methods for causing the temperature coefficient of the wavelength to be closer to zero are described. As Embodiment 3, a method for setting the temperature coefficient of the wavelength negative is described. As Embodiments 4 and 5, LED systems including a plurality of nitride semiconductor light emitting elements are described.

(Embodiment 1)

A nitride semiconductor light emitting element according to a first embodiment of the present disclosure is described with reference to the drawings.

Figure 1A:
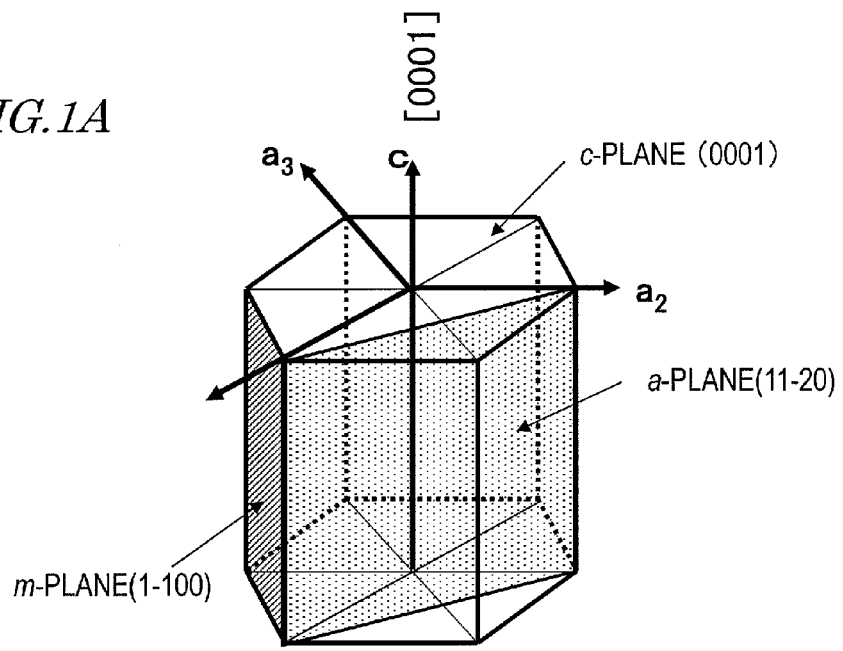
FIGS. 1A to 1C illustrate a wurtzite crystal structure.
Figure 1B:
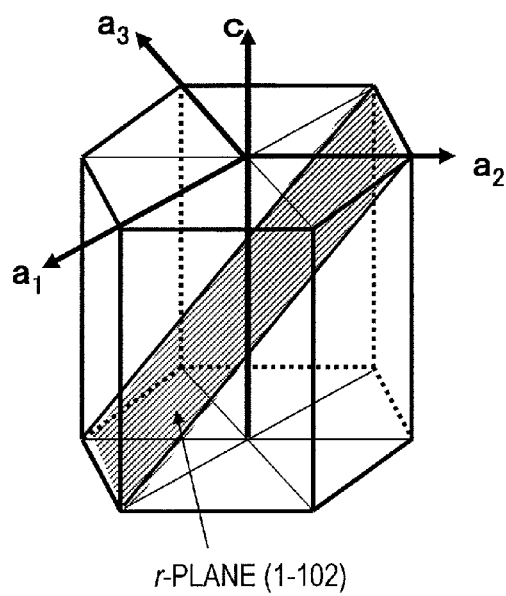
Figure 1C:
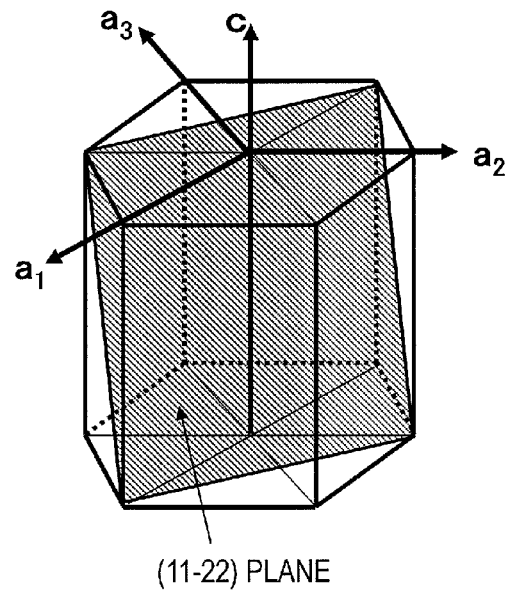
Figure 2A:
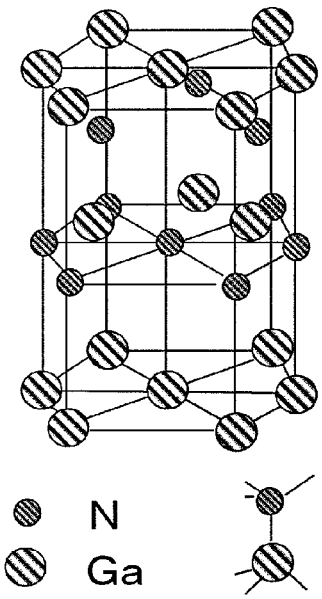
FIGS. 2A to 2C illustrate a crystal structure of a nitride semiconductor represented by a ball-and-stick model.
Figure 2B:
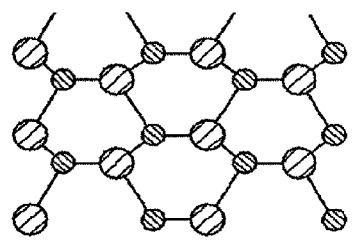
Figure 2C:
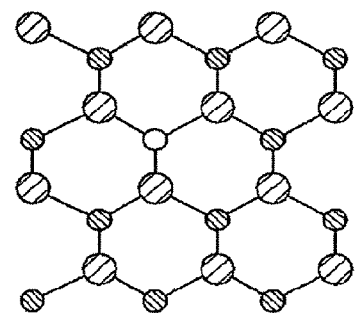
Figure 3A:
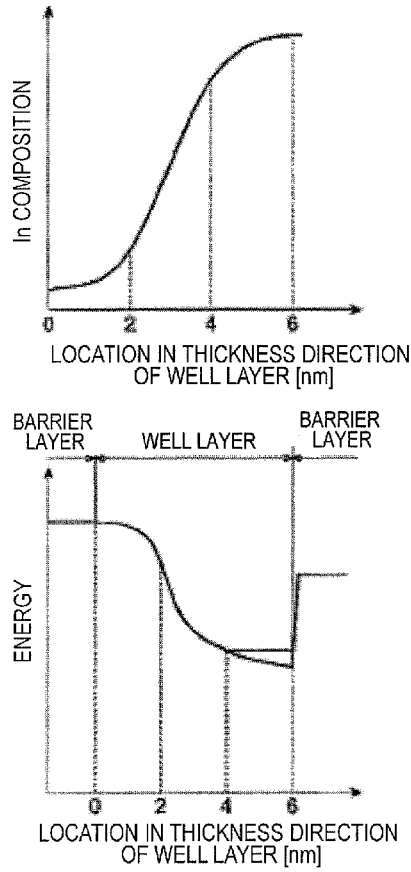
FIGS. 3A and 3B are graphs showing the In composition ratio and the energy in a depth direction of a well layer.
Figure 3B:
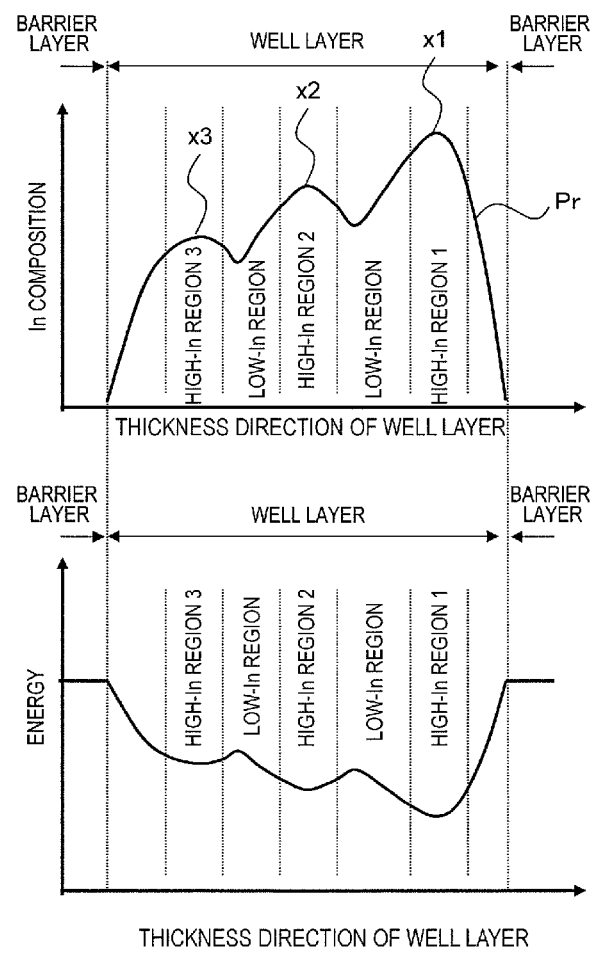

First, an $In_xGa_{1-x}N$ well layer ($0<x\leq1$) is described with reference to FIG. 3. FIG. 3A shows graphs of the profile of the In composition ratio and the energy in an InGaN well layer in the conventional nitride semiconductor light emitting element disclosed in Japanese Patent Application Laid-Open Publication No. 2009-253164. FIG. 3B shows graphs of the profile of the In composition ratio and the energy in an InGaN well layer in the nitride semiconductor light emitting element of this embodiment. In the conventional structure, the In composition ratio changes in a monotonous manner, and thus, there is only one location at which the energy is stable, that is, at which the energy is the lowest (in the drawings, the location of 6 nm in the thickness direction of the well layer). Therefore, electrons and holes which have been injected into the InGaN well layer emit light at this location at which the energy is stable. Even when the temperature of the nitride semiconductor light emitting element is changed, the location at which the energy is the lowest preferentially emits light.

On the other hand, a light emitting layer in the nitride semiconductor light emitting element in this embodiment has an $In_xGa_{1-x}N$ well layer ($0<x\leq1$) having a principal surface that is an m-plane. The $In_xGa_{1-x}N$ well layer is sandwiched between $In_yGa_{1-y}N$ layers ($0\leq y<1$) (barrier layers). The profile in the depth direction (depth profile) Pr of the In composition ratio (x) in the $In_xGa_{1-x}N$ well layer has a plurality of peaks x1 to x3. The values of the In composition ratios (x) at the plurality of peaks x1 to x3 are different from one another.

The profile in the depth direction of the InGaN well layer (thickness direction of the layer) changes in a wave-like manner. In this embodiment, each of regions around the peaks x1 to x3 is referred to as "high-In region" whereas each of regions between the high-In regions is referred to as "low-In region".

It is believed that, by forming the plurality of peaks (high-In regions) in the thickness direction in this way, light can be emitted in a plurality of energy states in accordance with the operating temperature. Specifically, compensation can be made with regard to light emission with a smaller bandgap as the temperature rises. Therefore, an elongated wavelength of the light as the temperature rises can be inhibited. In the following, a light emission process assumed by the present inventors is specifically described with reference to FIG. 4.

Portions (a), (b) and (c) of FIG. 4 illustrate energy states in a conduction band and a valence band in the InGaN well layer in this embodiment. Portion (a) of FIG. 4 illustrates the state of light emission of the nitride semiconductor light emitting element during low temperature operation. Portion (c) of FIG. 4 illustrates the state of light emission of the nitride semiconductor light emitting element during high temperature operation. Portion (b) of FIG. 4 illustrates the state of light emission of the nitride semiconductor light emitting element during medium temperature operation therebetween. With regard to the high-In regions, the maximum value (peak) of the In composition ratio, the bandgap, and the emission wavelength in a high-In region 1 are represented by x1, Eg1, and λ1, respectively. The maximum value of the In composition ratio, the bandgap, and the emission wavelength in a high-In region 2 are represented by x2, Eg2, and λ2, respectively. The maximum value of the In composition ratio, the bandgap, and the emission wavelength in a high-In region 3 are represented by x3, Eg3, and λ3, respectively. The In composition ratios x, the bandgaps Eg, and the emission wavelengths λ satisfy the following relationship.

$x1>x2>x3$ $Eg1<Eg2<Eg3$ $\lambda1>\lambda2>\lambda3$

In the cases illustrated in portions (b) and (c) of FIG. 4, the operating temperature is higher than that in the case illustrated in portion (a) of FIG. 4. In this case, the bandgap and the emission wavelength are determined by (Expression 1) and (Expression 2). The bandgaps during the medium temperature operation illustrated in portion (b) of FIG. 4 are represented by Eg1', Eg2', and Eg3'. The emission wavelengths during the medium temperature operation illustrated in portion (b) of FIG. 4 are represented by λ1', λ2', and λ3'. The bandgaps during the high temperature operation illustrated in portion (c) of FIG. 4 are represented by Eg1", Eg2", and Eg3". The emission wavelengths during the high temperature operation illustrated in portion (c) of FIG. 4 are represented by λ1", λ2", and λ3". In this case, the following relationship is satisfied.

$Eg1"<Eg1'<Eg1$ $Eg2"<Eg2'<Eg2$ $Eg3"<Eg3'<Eg3$ $\lambda1">\lambda1'>\lambda1$ $\lambda2">\lambda2'>\lambda2$ $\lambda3">\lambda3'>\lambda3$ Since a low-In region 1 is formed between the high-In region 1 and the high-In region 2, an energy barrier exists between the high-In region 1 and the high-In region 2. An energy barrier on the conduction band side is represented by ΔEgc1. An energy barrier on the valence band side is represented by ΔEgv1. Similarly, a low-In region 2 is formed between the high-In region 2 and the high-In region 3. An energy barrier on the conduction band side is represented by $\Delta Egc2$. An energy barrier on the valence band side is represented by $\Delta Egv2$.

During the low temperature operation illustrated in portion (a) of FIG. 4, light emission in the high-In region 1 in which the bandgap is the smallest is dominant, and the emission wavelength $\lambda 1$ is long. As illustrated in portion (b) of FIG. 4, when the operating temperature of the nitride semiconductor light emitting element rises and the electrons and the holes are thermally excited, there are electrons and holes which do not emit light in the high-In region 1 and overcome the energy barriers $\Delta Egc1$ and $\Delta Egv1$ to move into the high-In region 2. An important point is that the energy state in the high-In region 2 is formed to be metastable. Specifically, the carriers which have overcome $\Delta Egc1$ and $\Delta Egv1$ to move into the high-In region 2 are metastable under a state in which the energy thereof is small in the high-In region 2, and preferentially emit light in the high-In region 2 without going back into the high-In region 1. The carriers emit light with the bandgap Eg2 which is larger than Eg1, and thus, the emission wavelength becomes shorter than $\lambda 1$. When the temperature further rises and, during the high temperature operation illustrated in portion (c) of FIG. 4, electrons and holes which have overcome the energy barriers $\Delta Egc1$ and $\Delta Egv1$, and further have overcome the energy barriers $\Delta Egc2$ and $\Delta Egv2$ are generated, and preferentially emit light in the high-In region 3.

As described above, as the operating temperature of the nitride semiconductor light emitting element rises, the region in which main light emission is carried out changes from the high-In region 1 through the high-In region 2 to the high-In region 3, and light is emitted in a region in which the bandgap is larger, that is, in a region in which the wavelength is shorter. Actually, the operating temperature is changed, and thus, the bandgap which mainly contributes to light emission changes from Eg1 through Eg2' to Eg3". Further, the emission wavelength changes from $\lambda 1$ through $\lambda 2'$ to $\lambda 3''$.

Therefore, by setting the In composition ratios x1, x2, and x3 in the respective high-In regions so that Eg1, Eg2', and Eg3" are as equal as possible, the temperature coefficient of the wavelength can be set closer to zero. Specifically, by determining the operating temperature range, based on (Expression 1), the range of change in bandgap as the temperature is changed is determined. During the low temperature operation, Eg1 is dominant, while, in the high temperature state, Eg3 is dominant, and thus, with regard to the In composition ratio, attention may be focused on the peaks x1 and x3 of the In composition ratio. When the temperature during the low temperature operation is represented by Tmin and the temperature during the high temperature operation is represented by Tmax, the change in bandgap $\Delta Eg\_T$ due to the temperature is approximately expressed based on (Expression 1) as follows.

[Math. 10]

$$\Delta Eg\_T = 4.54 \times 10^{-4} \times (Tmax - Tmin)[eV] \quad \text{(Expression 3)}$$

When the bandgap of GaN is 3.4 eV and the bandgap of InN is 0.9 eV, a difference in bandgap $\Delta Eg\_31$ which is determined by the peak x1 in the high-In region 1 and the peak x3 in the high-In region 3 is expressed as follows.

[Math. 11]

$$\Delta Eg\_31 = 4.3 \times (x1 - x3)[eV] \quad \text{(Expression 4)}$$

Since the values of the peaks x1 and x3 may be set so that $\Delta Eg\_T$ and $\Delta Eg\_31$ are substantially equal to each other, the difference in In composition ratio between the peak x1 in the high-In region 1 and the peak x3 in the high-In region 3 may satisfy the following expression.

[Math. 12]

$$x1 - x3 = 1.056 \times 10^{-4} \times (Tmax - Tmin) \quad \text{(Expression 5)}$$

Specifically, when the temperature during the low temperature operation is 233 K ($-40°$ C.) and the temperature during the high temperature operation is 453 K (180° C.), the difference in In composition ratio x1-x3 is 2.32%.

As is described in detail in Examples, since an actual nitride semiconductor light emitting element is operated by current injection, a band filling phenomenon occurs due to the current injection. Specifically, as the current density in the InGaN well increases, the density of states in the high-In region 1 becomes an occupied state, and there occurs a phenomenon in which light is emitted in higher energy states, that is, in the high-In region 2 and in the high-In region 3 without thermal excitation. Therefore, it is desired that the actual difference in n composition ratio be set higher than the value determined by (Expression 5).

The energy barriers $\Delta Egc1$, $\Delta Egv1$, $\Delta Egc2$, and $\Delta Egv2$ play an important role in causing electrons and holes to be metastable in the high-In region 2 and the high-In region 3. Specifically, when $\Delta Egc1$, $\Delta Egv1$, $\Delta Egc2$, and $\Delta Egv2$ are significantly large with respect to thermal excitation energy, electrons and holes in the high-In region 1 cannot move into the high-In region 2 and the high-In region 3. It is desired that $\Delta Egc1$, $\Delta Egv1$, $\Delta Egc2$, and $\Delta Egv2$ be not less than 10 meV and not more than 80 meV. This approximately corresponds to, in terms of In composition ratio, about not less than 0.5% and not more than 4%. In other words, it is desired that the difference between the minimum value of the In composition ratio in a low-In region sandwiched between a high-In region and another high-In region and a larger one of the maximum values of the In composition ratios in the high-In regions adjacent to each other be not less than 0.5% and not more than 4%. As a result, the temperature coefficient of the wavelength can be set closer to zero.

By the above-mentioned method, In concentrations in the high-In regions and the low-In regions in the InGaN well layer can be controlled to set the temperature coefficient of the wavelength to be zero at any one of the ambient temperatures from 243 K ($-30°$ C.) to 353 K (80° C.). Further, at the ambient temperature from 243 K ($-30°$ C.) to 353 K (80° C.), the amount of change in wavelength as the temperature is changed can be 2 nm or less. Specifically, the difference between a shorter one of the wavelength at 243 K and the wavelength at 353 K, and the wavelength at the temperature at which the temperature coefficient is zero can be 2 nm or less. In this case, the average value of the temperature coefficients of the wavelengths from 243 K to 353 K is, for example, +0.02 [nm/K] or less.

Further, the temperature coefficient of the wavelength can be set to be zero at any one of the ambient temperatures from 233 K ($-40°$ C.) to 393 K (120° C.). Further, at the ambient temperature from 233 K ($-40°$ C.) to 393 K (120° C.), the amount of change in wavelength as the temperature is changed can be 5 nm or less. In other words, the difference between a shorter one of the wavelength at 233 K and the wavelength at 393 K, and the wavelength at the temperature at which the temperature coefficient is zero can be 5 nm or less. In this case, the average value of the temperature coefficients of the wavelengths from 233 K to 393 K is, for example, +0.03 [nm/K] or less.

Further, it is desired that the high-In regions in the InGaN well layer be arranged in the order of the high-In region 1, the high-In region 2, the high-In region 3, . . . in a direction from a p-type layer toward an n-type layer in the nitride semiconductor light emitting element. Specifically, in portion (a) of FIG. 4, the right side of the figure as seen from the front is the p-type semiconductor side, while the left side of the figure as seen from the front is the re-type semiconductor side. Holes have a large effective mass and a small mobility, and thus, are less liable to diffuse, but, in this structure, by placing the high-In region 1 on the p-type semiconductor side, holes can be injected preferentially into the high-In region 1. Specifically, the values of the In composition ratios x at the plurality of peaks may become smaller in the direction from the p-type layer toward the n-type layer, and, in this case, holes which are less liable to diffuse can be injected into a region having a peak at which the In composition ratio is the highest. However, no matter which the direction is, if the In composition ratios at the peaks become smaller in the order of the arranged high-In regions, the carriers move from a high-In region to an adjacent high-In region as the temperature is changed, and the high-In region in which the main light emission is carried out changes in the order. Specifically, the values of the In composition ratio x at the plurality of peaks may become larger in the direction from the p-type layer toward the n-type layer, or, may be arranged so as to be V-shaped (in the shape of V) or so as to be inverted V-shaped (in the shape of inverted V).

The InGaN well layer having a thickness of 7 nm or more allows two or more high-In regions to be easily formed along the thickness direction of the $In_xGa_{1-x}N$ well layer (0<x≤1). The thickness of the InGaN well layer can be 8 nm or more, or 9 nm or more.

As is described in detail in Examples, in order to set the temperature coefficient of the wavelength to be in a range of −0.03 to +0.03 [nm/K] (the absolute value to be 0.03 [nm/K] or less) or in a range of −0.01 to +0.01 [nm/K] (the absolute value to be 0.01 [nm/K] or less), setting of the operating current is also important. A current density J of the InGaN well layer is defined by I/S_well. Where represents the current value input into the nitride semiconductor light emitting element and S_well represents the area of the InGaN well layer in the top view of the nitride semiconductor light emitting element. When the InGaN well width is represented by W, it is desired that J and W satisfy the following relationship.

[Math. 13]

$$10.42 \times W[nm] - 81.3 \leq J[A/cm^2] \leq 10.42 \times W[nm] - 61.3 \quad \text{(Expression 6)}$$

Further, in order to set the temperature coefficient of the wavelength negative, J and W may satisfy the following relationship.

[Math. 14]

$$1 J[A/cm^2] < 10.42 \times W[nm] - 71.3$$

In FIG. 3 and FIG. 4, three high-In regions are depicted. However, two high-In regions may be used. Alternatively, four or more high-In regions may be used. In this case, the In composition ratios may be arranged so as to be V-shaped or so as to be inverted V-shaped in the direction from the p-type layer toward the n-type layer. Similarly to the case illustrated in FIG. 3 and FIG. 4, such a shape causes the carriers to move from a high-In region to an adjacent high-In region as the temperature is changed and causes the high-In region in which the main light emission is carried out to change in the order. Further, such a shape allows the plurality of In regions where the electrons and the holes are metastable to be easily formed. For this reason, the operating current range can be expanded.

When a conventional $In_xGa_{1-x}N$ well layer (0<x≤1) having a principal surface that is a c-plane is used, an intense piezoelectric field is generated in the $In_xGa_{1-x}N$ well layer, and thus, the energy state of the conduction band and the valence band as illustrated in FIG. 4 cannot be realized. Therefore, this embodiment can be realized only by a non-polar plane such as an m-plane or an a-plane or a plane on which the influence of spontaneous electrical polarization is sufficiently small.

Next, a structure of the nitride semiconductor light emitting element of this embodiment is described with reference to portions (a) and (b) of FIG. 5. Portion (a) of FIG. 5 is a top view schematically illustrating the nitride semiconductor light emitting element in the embodiment of the present disclosure. Portion (b) of FIG. 5 is a sectional view taken along the line X-X' of portion (a) of FIG. 5. A nitride semiconductor light emitting chip 300 includes, for example, a substrate 304 having an m-plane GaN layer at least on a surface thereof, an n-type nitride semiconductor layer 305 formed on the substrate 304, a nitride semiconductor active layer 306, a p-type nitride semiconductor layer 307, a p-side electrode 308 formed so as to be in contact with the p-type nitride semiconductor layer 307, and an n-side electrode 309 formed so as to be in contact with the n-type nitride semiconductor layer 305.

A nitride semiconductor is a GaN-based semiconductor, and more specifically, is an $Al_xIn_yGa_zN$ (x+y+z=1, x≥0, y≥0, z>0) semiconductor. The nitride semiconductor active layer 306 is formed substantially in parallel with the m-plane. The nitride semiconductor light emitting chip 300 is electrically connected via bumps 303 to wiring 302 on a mounting substrate 301. Such a structure is called a flip chip structure.

Further, as illustrated in FIG. 6, a wire bonding structure can also be realized. In FIG. 6, the p-side electrode 308 is electrically connected to the wiring 302 on the mounting substrate 301, and the n-side electrode 309 is electrically connected using an Au wire 310 to the wiring 302 on the mounting substrate 301.

The difference between a flip chip structure and a wire bonding structure arises from difference in the method of connecting the p-side electrode 308 and the n-side electrode 309 to the wiring 302 on the mounting substrate 301. The structures are similar to each other on other points, and thus, in the following, Embodiment 1 is described with reference to FIG. 5.

An "m-plane" includes not only a plane which is completely in parallel with the m-plane but also planes which are tilted relative to the m-plane by an angle of ±5° or less. When a plane is slightly tilted relative to the m-plane, influence of spontaneous electrical polarization is very small. On the other hand, in the crystal growth technology, there are cases in which epitaxial growth of a semiconductor layer is easier on a substrate which is slightly tilted than on a substrate which is strictly identical to the crystal orientation. Therefore, there are cases in which it is useful to tilt the crystal plane for the purpose of improving the quality of a semiconductor layer to be epitaxially grown and to increase the crystal growth speed while the influence of spontaneous electrical polarization is sufficiently inhibited.

The substrate 304 may be a hexagonal m-plane GaN substrate. Further, the substrate 304 may be a hexagonal m-plane SiC substrate having an m-plane GaN layer formed on a surface thereof. Alternatively, the substrate 304 may be an r-plane, m-plane, or a-plane sapphire substrate having an m-plane GaN layer formed on a surface thereof.

The n-type nitride semiconductor layer 305 is formed of, for example, n-type $Al_uGa_vIn_wN$ (u+v+w=1, u≥0, v≥0, w≥0). As an n-type dopant, for example, silicon (Si) can be used.

The nitride semiconductor active layer 306 has an $In_xGa_{1-x}N$ well layer (0<x≤1) sandwiched between $In_yGa_{1-y}N$ barrier layers (0≤y<1). A single $In_xGa_{1-x}N$ well layer (0<x≤1) may be provided. Alternatively, the nitride semiconductor active layer 306 may have a GaInN/GaInN multiple quantum well (MQW) structure in which $In_xGa_{1-x}N$ well layers (0<x≤1) and $In_yGa_{1-y}N$ barrier layers (0≤y<1) are alternately stacked. The wavelength of light emitted from the nitride semiconductor light emitting chip 300 depends on the In composition ratio x in the $In_xGa_{1-x}N$ semiconductor which is the semiconductor composition of the well layer. Since a piezo-electric field is not generated in the nitride semiconductor active layer 306 formed on the m-plane, the $In_xGa_{1-x}N$ well layer (0<x≤1) can be formed to be as thick as 7 nm or more.

The p-type nitride semiconductor layer 307 is formed of, for example, a p-type $Al_sGa_tN$ (s+t=1, s≥0, t≥0) semiconductor. As a p-type dopant, for example, Mg is doped. As a p-type dopant other than Mg, for example, Zn or Be may also be used. In the p-type nitride semiconductor layer 307, an Al composition ratio s may be uniform in the thickness direction, or the Al composition ratio s may be changed in a continuous or stepwise manner in the thickness direction. Specifically, the thickness of the p-type nitride semiconductor layer 307 is, for example, about 0.05 to 2 µm. A portion of the p-type nitride semiconductor layer 307 in proximity to an upper surface thereof, that is, in proximity to an interface with the p-side electrode 308, may be formed of a semiconductor of which Al composition ratio s is zero, that is, GaN. Further, in this case, GaN contains a high concentration of a p-type impurity, and thus, can function as a contact layer.

The p-side electrode 308 can cover substantially the entire surface of the p-type nitride semiconductor layer 307. The p-side electrode 308 is formed of a multilayer structure of a Pd layer and a Pt layer (Pd/Pt). Further, in order to enhance the reflectivity, a multilayer structure of an Ag layer and a Pt layer (Ag/Pt) or a multilayer structure of a Pd layer, an Ag layer, and a Pt layer (Pd/Ag/Pt) may also be used.

The n-side electrode 309 is formed of, for example, a multilayer structure of a Ti layer and a Pt layer (Ti/Pt). In order to enhance the reflectivity, a multilayer structure of a Ti layer, an Al layer, and a Pt layer (Ti/Al/Pt) may also be used.

Next, a manufacturing method according to Embodiment 1 is described again with reference to FIG. 5.

The n-type nitride semiconductor layer 305 is epitaxially grown using MOCVD on the n-type GaN substrate 304 having a principal surface that is the M-plane. As an n-type impurity, for example, silicon is used. TMG (Ga $(CH_3)_3$) and $NH_3$ are supplied as the materials. The n-type nitride semiconductor layer 305 of GaN is formed at a growth temperature of about not less than 900° C. and not more than 1,100° C. to have a thickness of about 1 to 3 µm.

Next, the nitride semiconductor active layer 306 is formed on the n-type nitride semiconductor layer 305. The nitride semiconductor active layer 306 has an InGaN/GaN multiple quantum well (MQW) structure in which, for example, $In_{1-x}Ga_xN$ well layers each having a thickness of 15 nm and GaN barrier layers each having a thickness of 30 nm are alternately stacked. When the $In_{1-x}Ga_xN$ well layer is formed, for the purpose of taking in In, the growth temperature can be set to be not less than 700° C. and not more than 800° C. Depending on the application of the nitride semiconductor light emitting element, the emission wavelength is selected, and the In composition ratio x is determined in accordance with the wavelength. When the wavelength is 450 nm (blue), the In composition ratio x is determined to be 0.25 to 0.27. When the wavelength is 520 nm (green), the In composition ratio x is 0.40 to 0.42. When the wavelength is 630 nm (red), the In composition ratio x is 0.56 to 0.58. The average value of the In composition ratios x of the $In_xGa_{1-x}N$ well layer (0<x≤1) may be not less than 0.08 and not more than 0.42. When the average value of the In composition ratios x is within this range, similar material properties are exhibited, and thus, the effect is most remarkably apparent in the structure of this embodiment. Specifically, the high-In region which allows the temperature characteristics of the wavelength to be zero or negative is easily formed.

As is described later as Example 1, by adjusting the thickness of the InGaN well layer, a plurality of emission centers (regions formed by peaks of the In composition ratio, in which the bandgap is small) can be formed in the thickness direction of the light emitting layer.

Further, also by changing an In supply ratio which is the ratio of the In material to the Group III materials ([TMI]/[TMG]+[TMI]), the In composition ratio can be changed in the thickness direction. Specifically, in forming the InGaN well layer, any one or both of the supply ratio of In and the supply ratio of Ga are changed as the time elapses. Since the In composition is higher under a condition in which the In supply ratio is higher, the supply ratio of the materials may be controlled so that the In supply ratio changes in a wave-like manner.

Further, also by changing the growth temperature in forming the InGaN well layer, the In composition ratio can be changed in the thickness direction. Specifically, the growth temperature in forming the InGaN well layer is changed as the time elapses. Since the In composition is higher under a condition in which the growth temperature is lower, the growth temperature may be changed in a wave-like manner.

The p-type nitride semiconductor layer 307 is formed on the nitride semiconductor active layer 306. As a p-type impurity, for example, Cp2Mg (cyclopentadienyl magnesium) is used. TMG and $NH_3$ are supplied as the materials. The p-type nitride semiconductor layer 307 of p-type GaN is formed at a growth temperature of about not less than 900° C. and not more than 1,100° C. to have a thickness of about 50 to 500 nm. The p-type nitride semiconductor layer 307 may include therein a p-AlGaN layer having a thickness of about 15 to 30 nm. By providing the p-AlGaN layer, an overflow of electrons during operation can be inhibited.

Next, for the purpose of activating the p-GaN layer, heat treatment is carried out at a temperature of about 800 to 900° C. for about 20 minutes.

Next, by carrying out dry etching using a chlorine-based gas, the p-type nitride semiconductor layer 307, the nitride semiconductor active layer 306, and the n-type nitride semiconductor layer 305 are partly removed to form a recess 312 and to expose a part of the n-type nitride semiconductor layer 305.

Next, the n-side electrode 309 is formed so as to be in contact with the exposed part of the n-type nitride semiconductor layer 305. As the n-side electrode 309, for example, a Ti/Pt layer is formed. Further, the p-side electrode 308 is formed so as to be in contact with the p-type nitride semiconductor layer 307. As the p-side electrode 308, for example, a Pd/Pt layer is formed. After that, heat treatment is carried out to alloy the Ti/Pt layer with the n-type nitride semiconductor layer 305, and alloy the Pd/Pt layer with the p-type nitride semiconductor layer 307.

After that, the n-type GaN substrate 304 is ground to be a thinned.

The nitride semiconductor light emitting element manufactured in this way is singulated into the nitride semiconductor light emitting chip 300. This singulating step can be carried out in some ways including laser dicing and cleavage.

The nitride semiconductor light emitting chip 300 singulated in this way is mounted on the mounting substrate 301. In this case, a flip chip structure is described.

The wiring 302 is formed in advance on the mounting substrate 301. As a main material of the mounting substrate, an insulator such as alumina or AlN, a metal such as Al or Cu, a semiconductor such as Si or Ge, or a composite material thereof can be used. When a metal or a semiconductor is used as a main material of the mounting substrate 301, the surface thereof can be covered with an insulating film. The wiring 302 may be placed in accordance with the shape of the electrodes of the nitride semiconductor light emitting chip 300. As the wiring 302, Cu, Au, Ag or Al can be used. These materials are formed on the mounting substrate 301 by sputtering or plating.

The bumps 303 are formed on the wiring 302. It is preferred to use Au as the bumps. Au bumps having a diameter of about 50 to 70 μm can be formed using a bump bonder. Further, the Au bumps can also be formed by Au plating. The nitride semiconductor light emitting chip 300 is connected using ultrasonic bonding to the mounting substrate 301 having the bumps 303 formed thereon in this way.

In this way, the semiconductor light emitting element of this embodiment is completed.

(Embodiment 2)

A second embodiment of the present disclosure is described with reference to the drawings.

FIG. 7 illustrates an exemplary circuit structure of an LED system (second embodiment) including a plurality of the nitride semiconductor light emitting elements of the first embodiment. A plurality of nitride semiconductor light emitting elements 313 of the first embodiment are connected in parallel. Each of the $In_xGa_{1-x}N$ well layers ($0<x\leq1$) in the nitride semiconductor light emitting elements has a thickness W in common. The operating current value of the entire plurality of nitride semiconductor light emitting elements 313 which are connected in parallel is represented by total, and the areas of the InGaN well layers in the top view of the nitride semiconductor light emitting elements 313 above are represented by S1, S2, S3, ... Sn. The total of the areas is represented by S_well_total and the value obtained by dividing I_total by S_well_total is represented by a current density J_total [A/cm²].

When a system using a plurality of LEDs is designed, first, a target total light amount is determined, and an input current value for the entire system is determined. In other words, I_total is determined first. Since W is determined at the time of manufacture of the nitride semiconductor light emitting elements, W cannot be changed later. However, S_well_total can be changed by the areas of the InGaN well layers and the number of the LEDs to be used. Therefore, by setting S_well_total based on (Expression 3) so as to satisfy the following relationship, an LED system in which the temperature coefficient of the wavelength is substantially zero can be realized.

[Math. 15]

$$10.42 \times W[nm] - 81.3 \leq \frac{I\_total}{S\_well\_total}[A/cm^2] \leq 10.42 \times W[nm] - 61.3 \quad \text{(Expression 7)}$$

Further, when a plurality of LEDs each having substantially the same thickness W of the $In_xGa_{1-x}N$ well layer ($0<x\leq1$) and substantially the same area S_well of the InGaN well layer in the top view are used, by setting the number of the LEDs so as to satisfy the following relational expression, an LED system in which the temperature coefficient of the wavelength is substantially zero can be realized.

[Math. 16]

$$10.42 \times W[nm] - 81.3 \leq \frac{I\_total}{N \times S\_well}[A/cm^2] \leq 10.42 \times W[nm] - 61.3 \quad \text{(Expression 8)}$$

Further, in this embodiment, as the entire system, the temperature coefficient of the wavelength can be set to be zero at any one of the ambient temperatures from 243 K (−30° C.) to 353 K (80° C.). Further, at the ambient temperature from 243 K (−30° C.) to 353 K (80° C.), the amount of change in wavelength as the temperature is changed can be 2 nm or less. Alternatively, the temperature coefficient of the wavelength can be set to be zero at any one of the ambient temperatures from 233 K (−40° C.) to 393 K (120° C.). Further, at the ambient temperature from 233 K (−40° C.) to 393 K (120° C.), the amount of change in wavelength as the temperature is changed can be 5 nm or less.

A plurality of the nitride semiconductor light emitting elements of the first embodiment are used in this way to eliminate the necessity for manufacturing nitride semiconductor light emitting elements having different areas of the InGaN well layers in the top view, and an arbitrary operating current value can be set by using a plurality of nitride semiconductor light emitting elements having the same structure. Therefore, there is an advantage in that the system design becomes easier, and the manufacturing cost is reduced. Such an LED system may be incorporated in a circuit as a part of a system.

(Embodiment 3)

A nitride semiconductor light emitting element according to a third embodiment of the present disclosure is described. Embodiment 3 is a nitride semiconductor light emitting element in which the wavelength of light becomes shorter when the temperature rises. In this embodiment, description of a structure similar to that in Embodiment 1 is omitted.

In Embodiment 1, the In composition ratios x1, x2, and x3 are set so that the bandgap values Eg1, Eg2', and Eg3" illustrated in FIG. 4 are as equal as possible. On the other hand, in this embodiment, the In composition ratios x1, x2, and x3 are set so that the following relationship holds. With this, the temperature coefficient of the wavelength can be set negative.

$$Eg1<Eg2'<Eg3''$$

Further, in Embodiment 1, the values of the peaks x1 and x3 are set so that $\Delta Eg\_T$ which is the change in bandgap due to the temperature is substantially equal to $\Delta Eg\_31$ which is the difference in bandgap determined by the peak x1 in the high-In region 1 and the peak x3 in the high-In region 3 (Expression 5). On the other hand, in this embodiment, since it is enough to set x1 and x3 so that $\Delta Eg\_31$ is larger than $\Delta Eg\_T$, it is enough that the difference between the maximum In composition ratio x1 in the high-In region 1 and the maximum In composition ratio x3 in the high-In region 3 satisfies the following expression.

[Math. 17]

$$x1-x3>1.056\times10^{-4}\times(Tmax-Tmin) \quad \text{(Expression 9)}$$

Further, it is enough that the current density J and the InGaN well width W satisfy the following relationship.

[Math. 18]

$$1 \le J[A/cm^2] < 10.42 \times W[nm] - 71.3 \quad \text{(Expression 10)}$$

According to this embodiment, the temperature coefficient of the wavelength can be set negative.

(Embodiment 4)

A fourth embodiment of the present disclosure is described with reference to the drawings.

The fourth embodiment is an LED system including one or a plurality of the nitride semiconductor light emitting elements 313 of the first embodiment and one or a plurality of other nitride semiconductor light emitting elements 314. The nitride semiconductor light emitting element(s) 314 is/are (a) nitride semiconductor light emitting element(s) (each) including an InGaN well layer having a principal surface that is a c-plane, or an InGaN well layer having a principal surface is an m-plane, the InGaN well layer having a thickness of 7 nm or less. The temperature coefficient of the wavelength of the nitride semiconductor light emitting element 314 is +0.05 to +0.06 [nm/K]. As described above, since the temperature coefficient of the wavelength of a nitride semiconductor is about +0.05 [nm/K] to +0.06 [nm/K], a conventional nitride semiconductor light emitting element can be used as the nitride semiconductor light emitting element 314.

It is desired that the current density range be set so that the temperature coefficient of the wavelength of the nitride semiconductor light emitting element 313 of the first embodiment is −0.05 to −0.06 [nm/K]. More specifically, when the thickness of the InGaN well layer in the nitride semiconductor light emitting element 313 of the first embodiment is represented by W, it is desired that the current density J be set so that the nitride semiconductor light emitting element 313 of the first embodiment satisfies the following relationship.

[Math. 19]

$$10.42 \times W[nm] - 106.3 < J[A/cm^2] < 10.42 \times W[nm] - 86.3 \quad \text{(Expression 11)}$$

By setting in this way, change in wavelength of the entire system as the temperature is changed can be compensated for.

FIG. 8A illustrates a temperature compensated LED system 323 including an LED block 321 in which N nitride semiconductor light emitting elements 313 of the first embodiment are connected in series, each of the elements 313 having the well layer thickness W and the InGaN well layer area S in the top view, and an LED block 322 in which M nitride semiconductor light emitting elements 314 are connected in series. A current of I_total1 flows through the LED block 321. A current of I_total2 flows through the LED block 322. In this case, it is desired that the total light amount output from the LED block 321 be substantially equal to the total light amount output from the LED block 322. By setting in this way, change in wavelength of the entire system as the temperature is changed can be compensated for.

By setting, in the LED block 321, W, S, and I_total1 to satisfy the following relationship:

[Math. 20]

$$10.42 \times W[nm] - 106.3 < \frac{I_{total}}{S}[A/cm^2] < 10.42 \times W[nm] - 86.3 \quad \text{(Expression 12)}$$

the temperature coefficient of the wavelength of the LED block 321 can be set to be −0.05 to −0.06 [nm/K], and change in wavelength of the entire LED system as the temperature is changed can be compensated for. Further, in the LED block 322 in FIG. 8A, a case in which the plurality of nitride semiconductor light emitting elements 314 are connected in series is described, but the nitride semiconductor light emitting elements 314 may be connected in parallel or in series, or may be placed so as to be matrix-like. When I_total1 is equal to I_total2, the LED block 321 and the LED block 322 can be connected in series as illustrated in FIG. 8B. In this case, only one current source is registered, which simplifies the LED system. Further, in FIGS. 8A and 8B, the LED block 321 and the LED block 322 are clearly distinguished, but the nitride semiconductor light emitting elements 313 of the first embodiment and the nitride semiconductor light emitting elements 314 may be placed within a plane in a variety of ways.

In this embodiment, in a predetermined temperature range, the temperature coefficient of the wavelength of light generated in the light emitting layers in the nitride semiconductor light emitting elements 313 can be set negative and the temperature coefficient of light generated in the light emitting layers in the nitride semiconductor light emitting elements 314 can be set positive. The "predetermined temperature range" is, specifically, at least a part of the temperature range when the system is operated. For example, when the system is operated under a temperature range from 233 K (−40° C.) to 453 K (180° C.), the "predetermined temperature range" is, for example, a range from 320 K to 453 K.

In this embodiment, synthesized light formed by synthesizing light generated in the light emitting layers in the nitride semiconductor light emitting elements 313 and light generated in the light emitting layers in the nitride semiconductor light emitting elements 314 is emitted from the system. In the predetermined temperature range, the amount of change in center wavelength of the synthesized light as the temperature is changed is, for example, 5 nm or less. In other words, the difference between the maximum value and the minimum value of the center wavelength of the synthesized light in the predetermined temperature range is 5 nm or less.

Further, by combining one or a plurality of the nitride semiconductor light emitting elements 313 of the first embodiment and one or a plurality of other nitride semiconductor light emitting elements 314, at the ambient temperature from 243 K (−30° C.) to 353 K (80° C.), the amount of change in wavelength as the temperature is changed can be 2 nm or less. Further, at the ambient temperature from 233 K (−40° C.) to 393 K (120° C.), the amount of change in wavelength as the temperature is changed can be 5 nm or less.

(Embodiment 5)

A fifth embodiment of the present disclosure is described with reference to the drawings.

FIG. 9 illustrate a temperature compensated LED system 323 including an LED block 321 in which N nitride semiconductor light emitting elements 313 of the first embodiment are connected in parallel, each of the elements 313 having the well layer thickness W and the InGaN well layer area S in the top view, and an LED block 322 in which M nitride semiconductor light emitting elements 314 are connected in parallel. A current of I_total1 flows through the LED block 321. A current of I_total2 flows through the LED block 322. In this case, it is desired that the total light amount output from the LED block 321 be substantially equal to the total light amount output from the LED block 322. By setting in this way, change in wavelength of the entire system as the temperature is changed can be compensated for.

By setting, in the LED block 321, W, S, I_total1, and N to satisfy the following relationship:

[Math. 21]

$$10.42 \times W[nm] - 106.3 < \frac{I\_total1}{S \times N}[A/cm^2] < 10.42 \times W[nm] - 86.3$$

(Expression 13)

the temperature coefficient of the wavelength of the LED block 321 can be −0.05 to −0.06 [nm/K], and change in wavelength of the entire LED system as the temperature is changed can be compensated for. Through parallel connection, the degree of freedom in setting the current density range increases. Further, in the LED block 322 in FIG. 9(a), a case in which the plurality of nitride semiconductor light emitting elements 314 are connected in parallel is described, but the nitride semiconductor light emitting elements 314 may be connected in parallel or in series, or may be placed so as to be matrix-like. When I_total1 is equal to I_total2, the LED block 321 and the LED block 322 can be connected in series as illustrated in FIG. 9(b). In this case, there is only one current source is required, which simplifies the LED system. Further, in FIGS. 9(a) and 9(b), the LED block 321 and the LED block 322 are clearly distinguished, but the nitride semiconductor light emitting elements 313 of the first embodiment and the nitride semiconductor light emitting elements 314 may be placed within a plane in a variety of ways.

EXAMPLE 1

Influence of the thickness of the InGaN well layer on light emitting characteristics was reviewed.

An n-type GaN substrate having a principal surface that was an M-plane was prepared, and a surface thereof was cleaned by sulfuric acid and hydrogen peroxide water. After that, the n-type GaN substrate was placed in a furnace for metal organic chemical vapor deposition. Heat treatment of the n-type GaN substrate was carried out in a gas mixture of nitrogen, hydrogen, and ammonia at 800° C. for 10 minutes. After that, the temperature of the substrate was raised from 800° C. to 1,000° C. in a gas mixture of trimethylgallium (TMG), hydrogen, nitrogen, ammonia, and silane. After the temperature of the substrate reached 1,000° C., the state was maintained to form an n-type GaN layer having a thickness of about 2 μm. After that, the temperature of the substrate was lowered to 785° C. After the temperature was lowered, a GaN barrier layer was formed in an atmosphere of trimethylgallium (TMG), nitrogen, and ammonia, and crystal growth of an InGaN well layer was formed in an atmosphere of trimethylgallium (TMG), trimethylindium (TMI), nitrogen, and ammonia. By repeating these steps, an InGaN light emitting layer having three cycles was formed. The supply rate of ammonia when the InGaN well layer was grown was 3.0 slm. The supply rate of TMI which was the material gas of In was 315 sccm, and the supply rate of TMG which was the material gas of Ga was 9 sccm. The In supply ratio in this case is 0.8. The growth time was controlled so that the thickness of the InGaN well layer was 9 nm and the thickness of the GaN barrier layer was 15 nm. The area of the InGaN well layer was 76,500 um².

For comparison, similar growth conditions were used to form, on an n-type GaN substrate having a principal surface that was an M-plane, an InGaN light emitting layer having three cycles of an InGaN well layer having a thickness of 3 nm and a GaN barrier layer having a thickness of 15 nm (Comparative Example 1). Further, similar growth conditions were used to form, on an n-type GaN substrate having a principal surface that was a c-plane, an InGaN light emitting layer having three cycles of an InGaN well layer having a thickness of 3 nm and a GaN barrier layer having a thickness of 15 nm (Comparative Example 2). Further, similar growth conditions were used to form, on an n-type GaN substrate having a principal surface that was a c-plane, an InGaN light emitting layer having three cycles of an InGaN well layer having a thickness of 9 nm and a GaN barrier layer having a thickness of 15 nm (Comparative Example 3). In Comparative Examples 1 to 3, the area of the InGaN well layer was the same as that in the example.

FIG. 10 shows the results of measurement of the temperature dependence of photoluminescence measurements with regard to samples of Example 1, Comparative Example 1, Comparative Example 2, and Comparative Example 3. The horizontal axis denotes the measurement temperature. The vertical axis denotes the peak wavelength of the photoluminescence measurements. The measurement temperature was changed from 10 K to 400 K. As an excitation light source, an He—Cd laser was used. The optical output of the laser was 10 mW.

In Comparative Example 3, almost no light emission from the InGaN well layer was observed. This means that, on the c-plane GaN, the influence of the piezo-electric field is large and a thick well layer cannot be formed. In Comparative Example I and Comparative Example 2, as the temperature rose, the peak wavelength of the photoluminescence measurements changed in a monotonous manner to the longer wavelength side. On the other hand, in Example 1, in a region of 300 K or lower, as the temperature rises, the peak wavelength of the photoluminescence measurements changed in a monotonous manner to the longer wavelength side, but, in a region higher than 320 K, a phenomenon that the peak wavelength changed to the shorter wavelength side was confirmed. The results mean that the temperature coefficient which is determined by the physical properties is controllable.

In Example 1 shown in FIG. 10, the temperature coefficient is zero at about 320 K, is positive in a temperature range of 150 K to 320 K, and is negative from 320 K to 400 K (in the "predetermined temperature range"). By forming a system by combining a light emitting element having a negative temperature coefficient with a light emitting element having a positive temperature coefficient from 320 K to 400 K, it is possible to reduce the difference between the wavelength of light emitted from the system in this temperature range and the wavelength of light emitted from the system at a temperature lower than 320 K.

FIG. 11 shows the results of analysis of the In composition ratio contained in the InGaN well layers using an atom probe method with regard to the sample of Example 1. The horizontal axis denotes the depth. The left side is the sample surface side. The right side is the M-plane GaN substrate side. The vertical axis on the right side denotes the In composition ratio. The vertical axis on the left side denotes the Ga composition ratio and the nitrogen composition ratio. Three InGaN well layers are formed. It can be seen that, in every InGaN well layers, the In composition ratio changes in a wave-like manner from the M-plane GaN substrate side toward the sample surface side. As shown by the measurement results in FIG. 11, "wave-like" means not only state that the profile of the In composition ratio is formed of a curve, but also a state that the profile includes a plurality of peaks and a region in which the In composition ratio is relatively small exists between two of the peaks. In FIG. 11, two to three high-In regions are formed in the thickness direction of the InGaN well layer having a thickness of 9 nm. The minimum value of the In composition ratio in a low-In region sandwiched between two of the high-In regions is different by about 1 to 2% from a larger one of the maximum values of the In composition ratios of the high-In regions adjacent to the low-In region.

EXAMPLE 2

An LED including the InGaN light emitting layer of an embodiment according to the present disclosure was actually manufactured, and the temperature characteristics thereof were studied.

An n-type GaN substrate having a principal surface that was an M-plane was prepared, and a surface thereof was cleaned by sulfuric acid and hydrogen peroxide water. After that, the n-type GaN substrate was placed in a furnace for metal organic chemical vapor deposition. Heat treatment of the n-type GaN substrate was carried out in a gas mixture of nitrogen, hydrogen, and ammonia at 800° C. for 10 minutes. After that, the temperature of the substrate was raised from 800° C. to 1,000° C. in a gas mixture of TMG, hydrogen, nitrogen, ammonia, and silane. After the temperature of the substrate reached 1,000° C., the state was maintained to form an n-type GaN layer having a thickness of about 2 μm. After that, the temperature of the substrate was lowered to 785° C. After the temperature was lowered, a GaN barrier layer was formed in an atmosphere of trimethylgallium (TMG), nitrogen, and ammonia, and crystal growth of an InGaN well layer was formed in an atmosphere of TMG, TMI, nitrogen, and ammonia. By repeating these steps, an InGaN light emitting layer having three cycles was formed. The supply rate of ammonia when the InGaN well layer was grown was 3.0 slm. The supply rate of TMI which was the material gas of In was 315 sccm, and the supply rate of TMG which was the material gas of Ga was 9 sccm. The In supply ratio in this case is 0.8. The area of the InGaN well layer was 76,500 um².

Next, the temperature of the substrate was raised from 785° C. to 950° C. in a gas mixture of TMG, hydrogen, nitrogen, and ammonia. Further, trimethylaluminum (TMAl) and bis-cyclopentadienyl magnesium (Cp2Mg) were added as materials to form a p-type AlGaN layer having a thickness of about 20 nm. Further, by forming a p-type GaN layer having a thickness of about 500 nm in a gas mixture of TMG, Cp2Mg, hydrogen, nitrogen, and ammonia, a nitride semiconductor multilayer structure was formed.

Using a conventional photolithography technology, a resist pattern was formed on the nitride semiconductor multilayer structure formed in this way, the p-type GaN layer, the p-type AlGaN layer, and the InGaN light emitting layer were partly removed by dry etching, and a part of the n-type GaN layer was exposed. An n-side electrode formed of a Ti/Al layer was formed so as to be in contact with the n-type GaN layer exposed in this way. Further, a p-side electrode formed of a Pd/Pt layer was formed so as to be in contact with the p-type GaN layer. A pad electrode formed of a Ti/Au layer was formed on the surface of each of the electrodes. Then, a rear surface of the M-plane GaN substrate was ground until the thickness of the M-plane GaN substrate was about 100 μm. After that, singulation into pieces of 300 μm×300 μm was made using a conventional dicing technology to form a nitride semiconductor chip.

By flip-chip mounting the nitride semiconductor chip formed in this way on a mounting substrate formed of AlN using a conventional flip-chip mounting method, a nitride semiconductor light emitting element was formed.

For the purpose of studying the influence of the InGaN light emitting layer, five kinds of samples of a nitride semiconductor light emitting element on an M-plane GaN substrate were prepared, the five kinds of samples respectively including: an InGaN well layer having a thickness of 3 nm and a GaN barrier layer having a thickness of 7 nm; an InGaN well layer having a thickness of 6 nm and a GaN barrier layer having a thickness of 7 nm; an InGaN well layer having a thickness of 9 nm and a GaN barrier layer having a thickness of 15 nm; an InGaN well layer having a thickness of 15 nm and a GaN barrier layer having a thickness of 30 nm; and an InGaN well layer having a thickness of 21 nm and a GaN barrier layer having a thickness of 30 nm.

Further, for comparison, as a nitride semiconductor light emitting element on a C-plane GaN substrate, a sample including an InGaN well layer having a thickness of 3 nm and a GaN barrier layer having a thickness of 15 nm was prepared.

FIG. 12 shows the relationship between the current density J and the temperature coefficient of the wavelength of the light emitting layer with regard to the nitride semiconductor light emitting elements manufactured in this way. In this case, the current density J of the light emitting layer is a value obtained by dividing the current value I input to the nitride semiconductor light emitting element by the area S_well of the InGaN well layer in the top view of the nitride semiconductor light emitting element. The measurement results shown in FIG. 12 are average temperature coefficients in a range of 300 K to 390 K. With regard to the samples in which the thickness of the well layer is 3 nm, the temperature coefficient of the wavelength is substantially constant irrespective of the operating current density both in the case of the C-plane GaN substrate and in the case of the M-plane GaN substrate, and the exhibited values are about +0.04 to +0.06 [nm/K]. With regard to the nitride semiconductor light emitting element in which the thickness of the well layer is 9 nm, the temperature coefficient is zero when the current density is [A/cm²], and the temperature coefficient is negative when the current density is less than 20 [A/cm²]. With regard to the nitride semiconductor light emitting element in which the thickness of the well layer is 15 nm, the temperature coefficient is zero when the current density is 90 [A/cm²], and the temperature coefficient is negative when the current density is less than 90 [A/cm²]. In this example, the temperature coefficient of the nitride semiconductor light emitting element is changed depending on the current density. By appropriately selecting the current density, the temperature coefficient of the wavelength during operation can be set negative.

FIG. 13 is a graph showing the relationship between the thickness of the InGaN well width and the current density when the temperature coefficient of the wavelength is zero and when the temperature coefficient of the wavelength is negative. Points plotted in the figure are actual measurement data when the temperature coefficient is zero with regard to samples in which the thickness of the InGaN well width is 9 nm, 15 nm, and 21 nm, respectively. It can be seen from the figure that the relationship between the thickness of the InGaN well width and the current density when the temperature coefficient of the wavelength is zero is substantially linear. A thick line in the figure is a straight line obtained through linear approximation of actual measurement points, and shows the current density when the temperature coefficient of the wavelength is zero. A region at the lower right with respect to the thick line in the figure shows a range in which the temperature coefficient of the wavelength is negative. In this example, the supply rate of a material gas of In was not changed, and thus, when the thickness of the InGaN well layer was 3 nm and 6 nm, the temperature coefficient of the wavelength was neither zero nor negative. Therefore, data in the cases in which the thickness of the InGaN well layer was 3 nm and 6 nm are not plotted in FIG. 13.

It can be seen from FIG. 13 that, under the conditions of this example, in order to realize a state in which the temperature coefficient of the wavelength is zero or negative, the InGaN well width may be 7 nm or more.

When the well width is represented by W [nm] and the current density is represented by J [A/cm$^2$], the current density J is zero when the following expression is satisfied.

[Math. 22]

$$J[A/cm^2]=10.42\times W[nm]-71.3 \quad \text{(Expression 14)}$$

Even if the current density changes by about ±10 [A/cm$^2$], the temperature coefficient of the wavelength is in a range of −0.03 to +0.03 [nm/K] or of −0.01 to +0.01 [nm/K], and thus, the temperature coefficient of the wavelength can be regarded as substantially zero. Therefore, with regard to a nitride semiconductor light emitting element having an InGaN well width of W, by operating the nitride semiconductor light emitting element in the current density range of the following expression,

[Math. 23]

$$10.42\times W[nm]-81.3\leq J[A/cm^2]\leq 10.42\times W[nm]-61.3 \quad \text{(Expression 15)}$$

the temperature coefficient of the wavelength can be set to be substantially zero. Further, when the operating current value or the operating current density has been determined, it is also possible to set the InGaN well width W from the following expression which is a modification of (Expression 15)

[Math. 24]

$$\frac{J[A/cm^2]+61.3}{10.42}\leq W[nm]\leq \frac{J[A/cm^2]+81.3}{10.42} \quad \text{(Expression 16)}$$

However, it is desired that W be 7 nm or more. Further, W may be 30 nm or less. By setting W to be 30 nm or less, defects in the InGaN well can be inhibited to enhance the luminous efficiency.

On the other hand, when the well width is represented by W [nm] and the current density is represented by J [A/cm$^2$], the current density J is negative when the following expression holds.

[Math. 25]

$$J[A/cm^2]<10.42\times W[nm]-71.3 \quad \text{(Expression 17)}$$

Further, a range of the well width W [nm] and the current density J [A/cm$^2$] in which the temperature coefficient of the wavelength is −0.05 to −0.06 [nm/K] is expressed by the following expression.

[Math. 26]

$$10.42\times W[nm]-106.3<J[A/cm^2]<10.42\times W[nm]-86.3 \quad \text{(Expression 18)}$$

According to the present disclosure, the nitride semiconductor light emitting element can be, for example, used outdoors with significant temperature change, or used in closed space with significant temperature rise. Further, application is possible to a use which requires inhibition of change in wavelength of the light source, such as a light source for a liquid crystal display or a liquid crystal projector.

While the present disclosure has been described with respect to preferred embodiments thereof, it will be apparent to those skilled in the art that the disclosed disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A nitride semiconductor light emitting element comprising a light emitting layer, wherein:
   the light emitting layer includes an $In_xGa_{1-x}N$ well layer, where 0<x≤1, having a principal surface that is an m-plane;
   a depth profile of an In composition ratio x in the $In_xGa_{1-x}N$ well layer has a plurality of peaks;
   values of the In composition ratios x at the respective plurality of peaks are different from one another;
   a temperature coefficient of a wavelength of light generated in the light emitting layer is zero at any one of temperatures from 243 K to 353 K; and
   a difference between a shorter one of the wavelength at 243 K and the wavelength at 353 K, and the wavelength at a temperature at which the temperature coefficient is zero is 2 nm or less.

2. An LED system comprising a plurality of the nitride semiconductor light emitting elements of claim 1, wherein:
   the plurality of the nitride semiconductor light emitting elements are connected in parallel; and
   a thickness W of the $In_xGa_{1-x}N$ well layer is the same throughout the plurality of the nitride semiconductor light emitting elements, W is 7 nm or more, and LED system is operated under a state in which the following relational expression is satisfied, [Math. 29]

$$10.42\times W[nm]-81.3\leq \frac{I\_total}{S\_well\_total}[A/cm^2]\leq 10.42\times W[nm]-61.3$$

where W is the thickness of the $In_xGa_{1-x}N$ well layer, I_total is an operating current value of the entire plurality of the nitride semiconductor light emitting elements that are connected in parallel, S_well_total is a total of areas of the $In_xGa_{1-x}N$ well layers in the top view of the respective plurality of the nitride semiconductor light emitting elements.

3. An LED system comprising N nitride semiconductor light emitting elements of claim 1, where N is an integer of 2 or more, wherein:
   the N nitride semiconductor light emitting elements are connected in parallel; and
   a thickness W and an area S_well are the same throughout the N nitride semiconductor light emitting elements, W is 7 nm or more, and the LED system is operated under a state in which the following relational expression is satisfied, [Math. 30]

$$10.42\times W[nm]-81.3\leq \frac{I\_total}{N\times S\_well}[A/cm^2]\leq 10.42\times W[nm]-61.3$$

where W is the thickness of the $In_xGa_{1-x}N$ well layer, S_well is the area of the $In_xGa_{1-x}N$ well layer in the top view of the N nitride semiconductor light emitting elements, and I_total is an operating current value of the entire N nitride semiconductor light emitting elements that are connected in parallel.

4. An LED system comprising:
one or a plurality of the nitride semiconductor light emitting elements of claim 1; and
a current supply portion for supplying current to the one or a plurality of the nitride semiconductor light emitting elements so that a temperature coefficient of a wavelength of light generated in the light emitting layer is zero at any one of temperatures from 243 K to 353 K, and so that a difference between a shorter one of the wavelength at 243 K and the wavelength at 353 K, and the wavelength at a temperature at which the temperature coefficient is zero is 2 nm or less.

5. A nitride semiconductor light emitting element comprising a light emitting layer, wherein:
the light emitting layer includes an $In_xGa_{1-x}N$ well layer $0<x\leq1$, having a principal surface that is an m-plane;
a depth profile of an In composition ratio x in the $In_xGa_{1-x}N$ well layer has a plurality of peaks;
values of the In composition ratios x at the respective plurality of peaks are different from one another;
a temperature coefficient of a wavelength of light generated in the light emitting layer is zero at any one of temperatures from 233 K to 393 K; and
a difference between a shorter one of the wavelength at 233 K and the wavelength at 393 K, and the wavelength at a temperature at which the temperature coefficient is zero is 5 nm or less.

6. An LED system comprising:
one or a plurality of the nitride semiconductor light emitting elements of claim 5; and
a current supply portion for supplying current to the one or a plurality of the nitride semiconductor light emitting elements so that a temperature coefficient of a wavelength of light generated in the light emitting layer is zero at any one of temperatures from 233 K to 393 K, and so that a difference between a shorter one of the wavelength at 233 K and the wavelength at 393 K, and the wavelength at a temperature at which the temperature coefficient is zero is 5 nm or less.

7. A nitride semiconductor light emitting element comprising a light emitting layer, wherein:
the light layer includes an $In_xGa_{1-x}N$ well layer, where $0<x\leq1$, having a principal surface that is an m-plane;
a depth profile of an In composition ratio x in the $In_xGa_{1-x}N$ well layer has a plurality of peaks;
values of the In composition ratios x at the respective plurality of peaks are different from one another;
the nitride semiconductor light emitting element further comprises a p-type layer and an n-type layer that are provided on the principal surface side and a rear surface side, respectively, of the light emitting layer;
the plurality of peaks include three or more peaks, and the values of the In composition ratios x at the three or more peaks become smaller or larger in a direction from the p-type layer toward the n-type layer.

8. A nitride semiconductor light emitting element comprising a light emitting layer, wherein:
the light emitting layer includes an $In_xGa_{1-x}N$ well layer, where $0<x\leq1$, having a principal surface that is an m-plane;
a depth profile of an In composition ratio x in the $In_xGa_{1-x}N$ well layer has a plurality of peaks;
values of the In composition ratios x at the respective plurality of peaks are different from one another;
the nitride semiconductor light emitting element further comprises a p-type layer and an n-type layer that are provided on the principal surface side and a rear surface side, respectively, of the light emitting layer;
the plurality of peaks include four or more peaks, and the values of the In composition ratios x at the four or more peaks are arranged so as to be V-shaped or inverted V-shaped in a direction from the p-type layer toward the n-type layer.

9. A nitride semiconductor light emitting element comprising a light emitting layer, wherein:
the light layer includes an $In_xGa_{1-x}N$ well layer, where $0<x\leq1$, having a principal surface that is an m-plane;
a depth profile of an In composition ratio x in the $In_xGa_{1-x}N$ well layer has a plurality of peaks;
values of the In composition ratios x at the respective plurality of peaks are different from one another; and
an absolute value of a temperature coefficient of a wavelength of light generated in the light emitting layer is 0.03 or less.

10. A nitride semiconductor light emitting element comprising a light emitting layer, wherein:
the light emitting layer includes an $In_xGa_{1-x}N$ well layer $0<x\leq1$, having a principal surface that is an m-plane;
a depth profile of an In composition ratio x in the $In_xGa_{1-x}N$ well layer has a plurality of peaks;
values of the In composition ratios x at the respective plurality of peaks are different from one another; and
a temperature coefficient of a wavelength of light generated in the light emitting layer is a negative value.

* * * * *